(12) United States Patent
Yamaguchi et al.

(10) Patent No.: US 11,769,736 B2
(45) Date of Patent: Sep. 26, 2023

(54) SCRIBE STRUCTURE FOR MEMORY DEVICE

(71) Applicant: Micron Technology, Inc., Boise, ID (US)

(72) Inventors: Hidenori Yamaguchi, Hiroshima (JP); Keizo Kawakita, Hiroshima (JP); Wataru Hoshino, Hiroshima (JP); Yuta Nomura, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/230,772

(22) Filed: Apr. 14, 2021

(65) Prior Publication Data

US 2022/0336372 A1    Oct. 20, 2022

(51) Int. Cl.
*H01L 23/00* (2006.01)
*H01L 23/544* (2006.01)
*H10B 12/00* (2023.01)

(52) U.S. Cl.
CPC .......... *H01L 23/562* (2013.01); *H01L 23/544* (2013.01); *H01L 2223/5446* (2013.01); *H10B 12/00* (2023.02)

(58) Field of Classification Search
CPC ... H01L 23/562; H01L 23/544; H01L 27/108; H01L 2223/544; H01L 2223/5446; H01L 23/3178; H01L 23/53295; H01L 21/3043; H01L 21/76801; H01L 21/76805; H01L 21/76831; H01L 21/76832; H01L 21/76895; H01L 21/78; H01L 23/5283; H10B 12/00; H10B 12/50

See application file for complete search history.

(56) References Cited

U.S. PATENT DOCUMENTS

| 7,417,304 B2 | 8/2008 | Tsutsue |
| 7,453,128 B2 | 11/2008 | Tsutsue et al. |
| 2002/0055256 A1* | 5/2002 | Jiang ................. H01L 21/76807 257/E21.579 |
| 2003/0143819 A1 | 7/2003 | Hedler et al. |
| 2005/0040532 A1 | 2/2005 | Kumar et al. |
| 2005/0142862 A1 | 6/2005 | Chun |

(Continued)

OTHER PUBLICATIONS

U.S. Appl. No. 17/230,827, titled "Scribe Structure for Memory Device", filed Apr. 14, 2021.

(Continued)

*Primary Examiner* — Thanh T Nguyen
(74) *Attorney, Agent, or Firm* — Dorsey & Whitney LLP

(57) ABSTRACT

Apparatuses and methods for manufacturing chips are described. An example method includes: forming at least one first dielectric layer above a substrate; forming at least one second dielectric layer above the first dielectric layer; forming a cover layer above the at least one second dielectric layer; forming a groove above the substrate by etching; covering at least an edge surface of the at least one first dielectric layer in the groove with a liner including polymer; forming a hole through the cover layer and a portion of the at least one second dielectric layer; depositing a conductive layer in the hole, on the cover layer and the liner; and forming a conductive pillar on the conductive layer in the hole by electroplating.

15 Claims, 24 Drawing Sheets

(56) References Cited

U.S. PATENT DOCUMENTS

| | | | |
|---|---|---|---|
| 2009/0283311 A1* | 11/2009 | Ida | H01L 27/14683 |
| | | | 29/846 |
| 2010/0059895 A1 | 3/2010 | Wakisaka | |
| 2010/0181650 A1 | 7/2010 | Shigihara et al. | |
| 2013/0113068 A1 | 5/2013 | Ramachandran et al. | |
| 2013/0181329 A1 | 7/2013 | Wada | |
| 2015/0235845 A1* | 8/2015 | Sekita | H01L 23/3114 |
| | | | 438/667 |
| 2015/0287687 A1 | 10/2015 | Farrens et al. | |
| 2016/0079204 A1 | 3/2016 | Matsubara et al. | |
| 2016/0365340 A1 | 12/2016 | Tajima et al. | |
| 2017/0256638 A1 | 9/2017 | Macelwee et al. | |
| 2018/0096952 A1 | 4/2018 | Miccoli | |
| 2019/0035750 A1 | 1/2019 | Han et al. | |
| 2020/0312715 A1 | 10/2020 | Choi et al. | |
| 2021/0391279 A1 | 12/2021 | Sugioka et al. | |

OTHER PUBLICATIONS

U.S. Appl. No. 17/237,992, titled "Scribe Structure for Memory Device", filed Apr. 22, 2021.

* cited by examiner

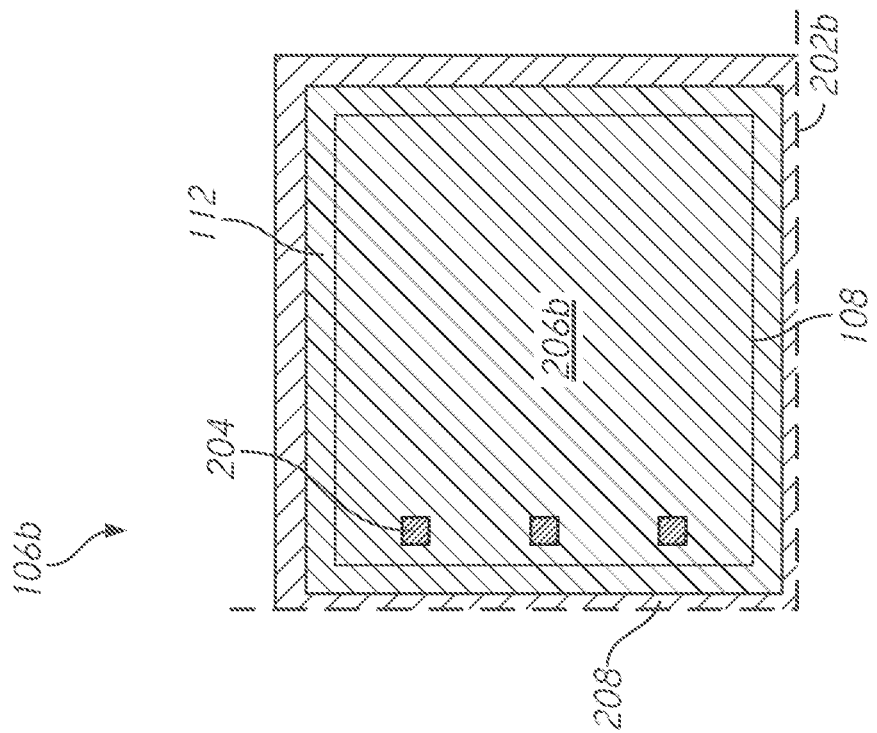
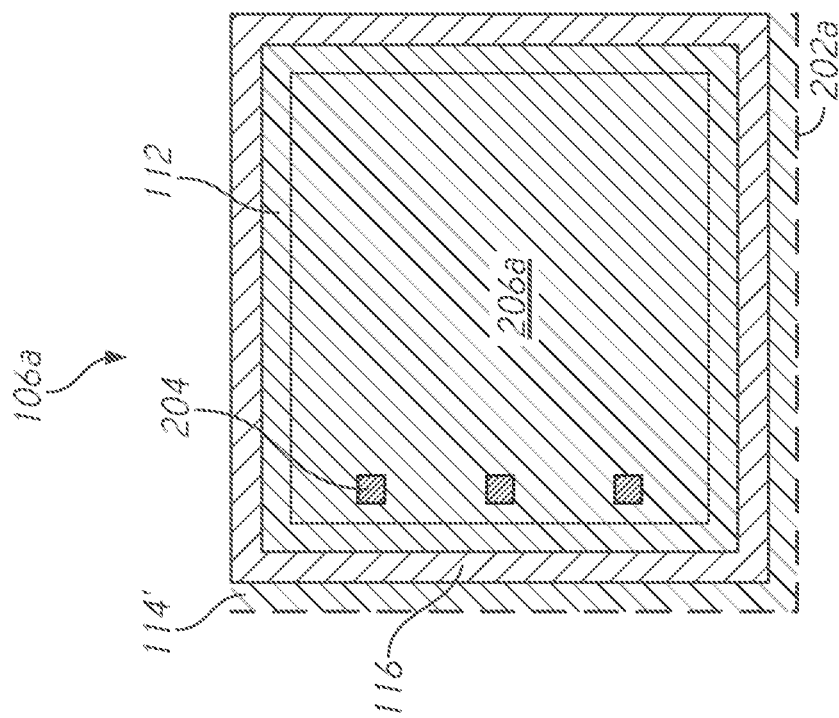
FIG. 2B
FIG. 2A

SCRIBE STRUCTURE FOR MEMORY DEVICE

BACKGROUND

High data reliability, high speed of memory access, lower power consumption and reduced chip size are features that are demanded from semiconductor memory. In recent years, some semiconductor devices such as dynamic random-access memory (DRAM) devices include a low-k film of an insulating material, such as silicon oxycarbide (SiOC) and silicon carbonitride (SiCN), having a low dielectric constant (k) that exhibits weaker electric polarization between conductive layers. The low-k film is included to reduce parasitic capacitance between the conductive layers and thus to achieve high speed operations of electronic circuits in the semiconductor devices.

However, the low-k material has weak thermo-mechanical characteristics. For example, a low-k film has lower adhesion to its adjacent conductive layer or conductive components (e.g., interconnects) compared to a silicon dioxide (SiO2) film and a silicon nitride (Si3N4) film. Additionally, the low-k material is brittle. Once semiconductor elements are formed on a semiconductor wafer, the semiconductor wafer is diced into semiconductor chips. During the dicing process, cracks may be produced. The cracks may propagate through a film interface between the low-k film and another dielectric film (e.g., between SiO2 and SiOC films, between SiCN/SiO2 films, etc.) and reach an element formation region of the semiconductor device, which results in a lower yield of the semiconductor devices.

In order to reduce the cracks during the dicing process, a groove may be formed in a scribe region film prior to dicing, such as by etching through layers including the low-k film. However, the edge surfaces of the low-k film facing the groove tend to have a concave shape due to the brittle characteristics of the low-k material. In order to form conductive pillar bumps on wires coupled to interconnects through layers, a conductive seed layer may be formed as an initial step of electroplating of the conductive material. However, because a conductive seed layer deposited on the concave portion of the low-k film tends to be discontinuous from one concave portion to another, the deposited layer fails to function as a seed layer.

BRIEF DESCRIPTION OF THE DRAWINGS

FIG. 2A is a diagram of a top view of a semiconductor chip in accordance with an embodiment of the present disclosure.

FIG. 2B is a diagram of a top view of a semiconductor chip in accordance with an embodiment of the present disclosure.

DETAILED DESCRIPTION

Various embodiments of the present disclosure will be explained below in detail with reference to the accompanying drawings. The following detailed description refers to the accompanying drawings that show, by way of illustration, specific aspects in which embodiments of the present disclosure may be practiced. These embodiments are described in sufficient detail to enable those skilled in the art to practice the embodiments of present disclosure. Other embodiments may be utilized, and structure, logical and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
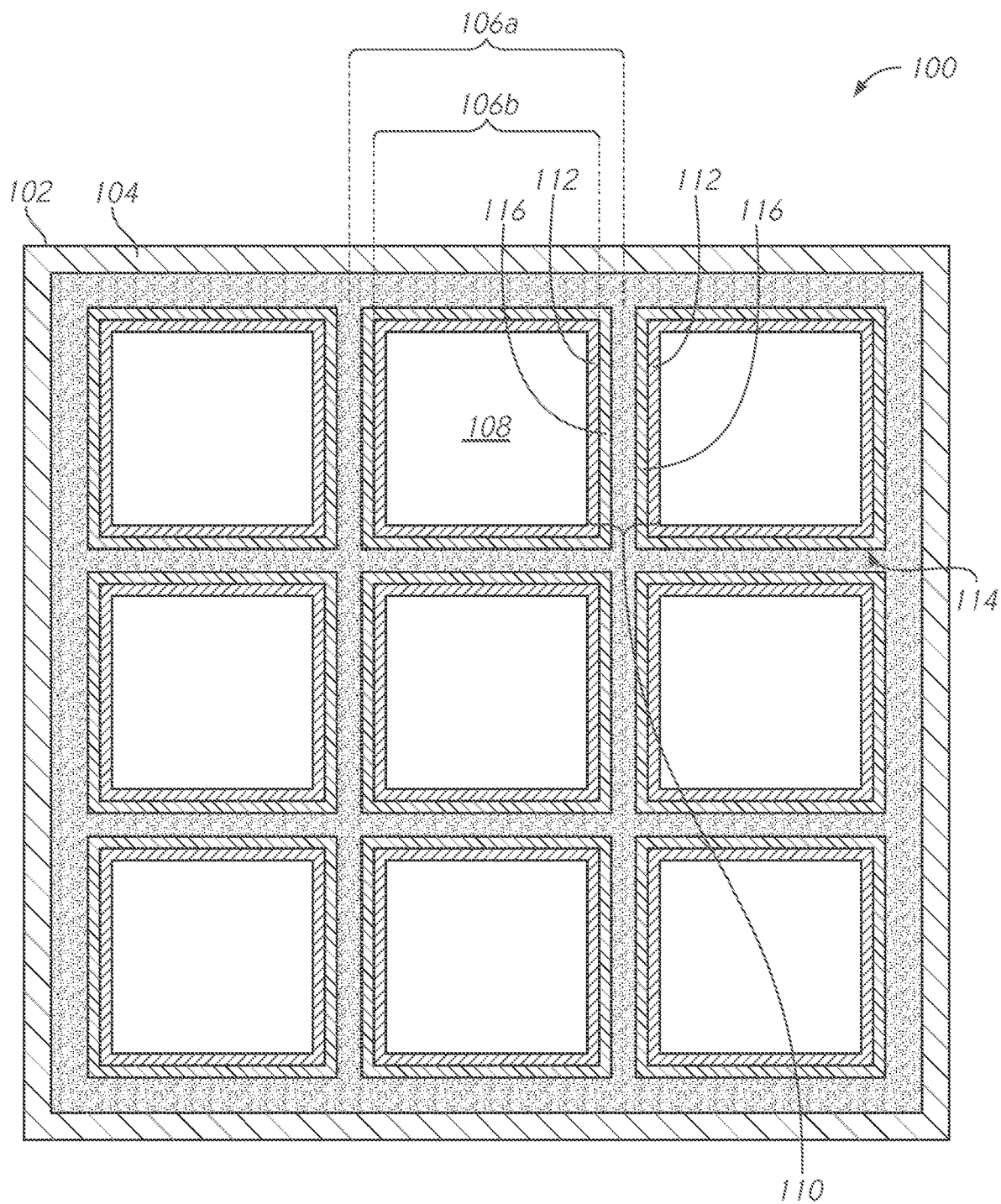
FIG. 1 is a diagram of a layout of a semiconductor device in accordance with an embodiment of the present disclosure.

FIG. 1 is a diagram for a layout of a semiconductor device 100 in accordance with an embodiment of the present disclosure. FIG. 1 is a plan view illustrating a schematic configuration of a layout of a plurality of circuit regions 108 and scribe regions 110 formed on a semiconductor device 100. In some embodiments, the semiconductor device 100 may be a semiconductor wafer. The semiconductor device 100 may include a mask region 102. The semiconductor device 100 may be manufactured using photo patterning by applying a mask, such as a photoresist, on each mask region 102. The semiconductor device 100 may include a margin region 104 along the perimeter of the mask region 102.

In some embodiments, the circuit regions 108 may be disposed in a matrix and each circuit region 108 may have a rectangular shape. In each circuit region 108, transistors and circuit components, such as conductive interconnects may be disposed. For example, the transistors and the circuit components may include a plurality of memory cells, one or more circuits that provide memory access functions, such as read operations and write operations to the memory cells, and a control circuit that controls the circuits.

The semiconductor wafer 100 in FIG. 1 may be in a state before the semiconductor wafer 100 is separated into semiconductor chips. In some embodiments, each of the semiconductor chips may be a chip 106a. In another embodiments, each of the semiconductor chips may be a chip 106b. The scribe region 110 may be disposed around each circuit region 108. The scribe region 110 may include a circuit edge 112 of each chip 106a surrounding each circuit region 108. In some embodiments, the circuit edge 112 may include a test element group (not shown) including test circuits. The scribe region 110 may also include grooves 116 between the circuit edges 112 of adjacent chips, and further includes a scribe center region 114 between the grooves 116. In some embodiments, some portion of the scribe region 110 may be etched to provide the grooves 116. In some embodiments, dicing lines may be defined in the scribe center region 114 for separating the semiconductor wafer 100 into individual semiconductor chips 106a. In some embodiments, dicing lines may be defined in the grooves 116 for separating the semiconductor wafer 100 into individual semiconductor chips 106b.

FIG. 2A is a diagram of a top view of the semiconductor chip 106a in accordance with an embodiment of the present disclosure. The semiconductor chip 106a may include a circuit region 108 surrounded by a circuit edge 112. In some embodiments, separating the semiconductor wafer 100 in FIG. 1 into chips 106a may be performed by a dicing step. The dicing step may be performed along dicing lines 202a in the scribe center region 114. After the dicing step, a portion 114' of the scribe center region 114 may remain outside the groove 116 of the semiconductor chip 106a. A cover layer 206a may be disposed on the top of the semiconductor chip 106a, including the scribe center region 114, the circuit edge 112 and the circuit region 108. The cover layer 206a may include holes, and conductive pillars 204 through the cover layer 206a that may be disposed in the circuit region 108. The conductive pillars 204 may be coupled to pads of the chip 106a.

FIG. 2B is a diagram of a top view of the semiconductor chip 106b in accordance with an embodiment of the present disclosure. The semiconductor chip 106b may include a circuit region 108 surrounded by a circuit edge 112 of the semiconductor chip 106a. In some embodiments, separating the semiconductor wafer 100 in FIG. 1 into chips 106b may be performed by a dicing step. The dicing step may be performed along dicing lines 202b in the grooves 116 of FIG. 1. After the dicing step, a portion 208 of the groove 116 remains with the circuit edge 112 and the circuit region 108 of the semiconductor chip 106b. A cover layer 206b may be disposed on the top of the semiconductor chip 106b, including the circuit edge 112 and the circuit region 108. The cover layer 206b may include holes, and conductive pillars 204 through the cover layer 206b that may be disposed in the circuit region 108. The conductive pillars 204 may be coupled to pads of the chip 106b. In some embodiments, the cover layer 206a or the cover layer 206b may be a dielectric film, and may include, for example, silicon nitride (Si3N4) and/or silicon carbide (SiC). In some embodiments, the conductive pillars 204 may include copper (Cu) or nickel (Ni).

In the following description of FIGS. 3-20, some embodiments with a wafer with grooves 116, a scribe center region disposed between the grooves and a dicing line in the scribe center region as shown in FIGS. 3-14. Alternatively, some embodiments with a wafer with a groove and a dicing line in the groove as shown in FIG. 15-20. However, each embodiment is not limited to one of these wafers; dicing lines may be provided in either scribe center regions or in grooves for each of the following embodiments.

In some embodiments, liners including polymer may cover edge surfaces of lower dielectric films (e.g., low-k films). The edge surfaces of lower dielectric films may have roughness. The edge surfaces of lower dielectric films may have concave portions, for example. In another example, the edge surfaces of lower dielectric films may be uneven. The polymer may further cover edge surfaces of upper dielectric films above the lower dielectric films.

Figure 3:
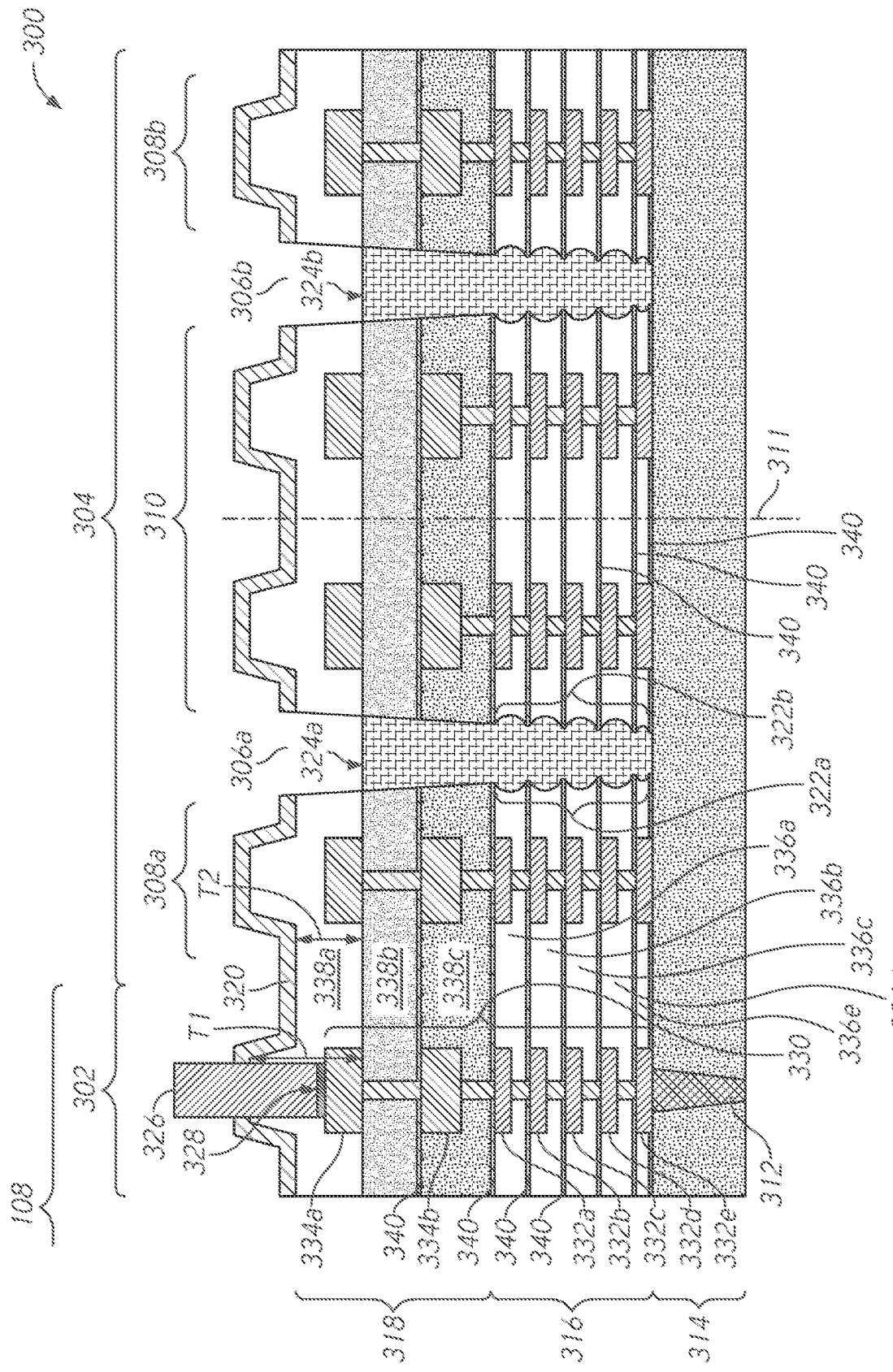
FIG. 3 is a diagram of vertical cross-sectional views of one schematic structure of a portion of a semiconductor device in accordance with an embodiment of the present disclosure.

FIG. 3 is a diagram of vertical cross-sectional views of one schematic structure of a portion 300 of a semiconductor device 100 in accordance with an embodiment of the present disclosure. In some embodiments, the portion 300 of the semiconductor device 100 may be a multilayer structure. The portion 300 of the semiconductor device 100 may include a semiconductor substrate 314. The semiconductor substrate 314 may include a monocrystalline silicon substrate, for example. Alternatively, the semiconductor substrate 314 may include silicon oxide (SiO2). The portion 300 of the semiconductor device 100 may include a sub region 302 of a circuit region 108. The semiconductor substrate 314 may include a through electrode 312 in the sub region 302. The portion 300 of the semiconductor device 100 may also include dielectric layers 316 disposed on the semiconductor substrate 314. In some embodiments, the dielectric layers 316 may include dielectric films (e.g., low-k films 336a-336e) including a low-k insulating material having a lower dielectric constant (k) that exhibits weaker electric polarization between conductive components relative to other dielectric materials, such as silicon dioxide (SiO2). For example, the low-k insulating material may include silicon oxycarbide (SiOC) and/or silicon carbonitride (SiCN). The portion 300 of the semiconductor device 100 may also include dielectric layers 318 (e.g., dielectric films 338a-338c) disposed on the dielectric layers 316. In some embodiments, the dielectric layers 318 may include silicon dioxide (SiO2). The dielectric layers 318 may also include a substance such as phosphorus (P) or boron (B). The semiconductor substrate 314, the dielectric layers 316 and 318 may be insulated from one another by dielectric layers 340 disposed between the adjacent dielectric layers 316 and 318, and the semiconductor substrate 314 and the dielectric layers 316 adjacent to the semiconductor substrate 314. In some embodiments, the dielectric layers 340 may include silicon nitride (Si3N4).

The portion 300 of the semiconductor device 100 may further include a scribe region 304 disposed between the circuit region 108 and another circuit region (not shown). The sub region 302 of the circuit region 108 include conductive wires 332a-332e disposed in the dielectric films 336a-336e, respectively. In some embodiments, the conductive wires 332a-332e may include copper (Cu). The sub region 302 of the circuit region 108 may also include conductive wires 334a and 334b disposed in the dielectric films 338a and 338c in the dielectric layers 318, respectively. In some embodiments, the conductive wires 334a and 334b may include aluminum (Al). The portion 300 of the semiconductor device 100 may include an interconnect 330 disposed in the sub region 302 of the circuit region 108. The interconnect 330 may include through electrodes, each disposed through two adjacent layers of the dielectric layers 316 and 318, and the dielectric layer 340 between the two adjacent layers. The interconnect 330 may couple (e.g., electrically connect) the conductive wires 332a-332e and the conductive wires 334a and 334b to the through electrode 312. In some embodiments, another interconnect may be further disposed in circuit edge 308a and circuit edge 308b and/or the scribe center region 310 of the portion 300 of the semiconductor device 100. In some embodiments, the other interconnect may be included in test circuits (not shown) disposed in the circuit edges 308a and circuit edge 308b and/or the scribe center region 310.

The portion 300 of the semiconductor device 100 may further include a cover layer 320 above one of the dielectric layers 318. In some embodiments, the cover layer 320 may be a dielectric layer including silicon nitride (Si3N4) and/or silicon carbide (SiC). The cover layer 320 and the dielectric layers 340 may prevent diffusion of the conductive material (e.g., copper diffusion). The cover layer 320 may include holes in the sub region 302 of the circuit region 108. The portion 300 of the semiconductor device 100 may further include conductive seed layer 328 in the holes in the dielectric layers 318. The conductive seed layer 328 is on the conductive wire 334a. The conductive seed layer 328 may be at an end of the interconnect 330, opposite to another end of the interconnect 330 that is on the semiconductor substrate 314. The portion 300 of the semiconductor device 100 may also include a conductive pillar 326 through the cover layer 320 and the dielectric film 338a that is a top layer of dielectric layers 318. The conductive pillar 326 may be disposed on the conductive seed layer 328 in the sub region 302 of the circuit region 108. In some embodiments, the conductive pillar 326 may include conductive material, such as copper (Cu) or nickel (Ni). The interconnect 330 may couple the conductive pillar 326 and the conductive wires 334a-334b and 332a-332e to the through electrode 312. In some embodiments, a portion of the dielectric layer 318 beneath the cover layer 320 including the conductive wire 334a may have a thickness T1 greater than a thickness T2 of the portion of the dielectric layer 318 between the circuit edge 308a and the conductive pillar 326 in the same cross-section. In some embodiments, the portion of the dielectric layer 318 having the greater thickness may include the conductive pillar 326. In some embodiments, the portion of the dielectric layer 318 having the greater thickness may be in the circuit edge 308a. The thicker portion of the dielectric layer 318 may provide support for the sub region 302 and the scribe region 304 including the interconnect 330, suppressing cracks around the interconnects in the sub region 302 and the circuit edge 308a.

The scribe region 304 may include circuit edges 308a and 308b of adjacent circuit regions, such as the circuit region 108 including the sub region 302 and the other circuit region (not shown). The scribe region 304 may also include a scribe center region 310 between the circuit edges 308a and 308b. In some embodiments, a dicing line 311 may be provided in the center of the scribe center region 310. The scribe region 304 may also include grooves 306a and 306b. In some embodiments, dicing lines may be provided in the centers of the grooves 306a and 306b. The grooves 306a and 306b may prevent force of dicing in the scribe center region 310 or in the grooves 306a and 306b from causing and propagating cracks in the various layers. In some embodiments, the portion 300 of the semiconductor device 100 may include one or more liners 324a and 324b disposed in the grooves 306a and 306b that cover at least a portion of edge surfaces of the dielectric layers 316 and 318 facing the grooves 306a and 306b, respectively. The liners 324a and 324b may include polymer, such as polyimide or phenolic resin. The liner 324a in the groove 306a may cover portions 322a and 322b of edge surfaces of the dielectric layers 316 facing the groove 306a. In some embodiments, the portions 322a and 322b may include concave portions in the edge surfaces of the dielectric films 336a-336e facing the groove 306a. Each concave portion of the concave portions in the portions 322a and 322b may correspond to each of the dielectric films 336a-336e between the dielectric layers 340 above and below each dielectric film.

Processes of providing the grooves 306a and 306b, the liners 324a and 324b and the conductive pillar 326 of the portion 300 of the semiconductor device 100 in accordance with various embodiments of the present disclosure will be described with reference to FIGS. 4 to 9B. A semiconductor substrate 314, dielectric layers 316 and 318 disposed on the semiconductor substrate 314, conductive wires 332a-332e and 334a-334b, the through electrodes 312 and interconnects 330 coupling the conductive wires 332a-332e and 334a-334b to the through electrodes 312 in FIGS. 4 to 9B have similar structures as the semiconductor substrate 314, the dielectric layers 316 and 318, the conductive wires 332a-332e and 334a-334b, the through electrode 312 and the interconnect 330 in FIG. 3. Thus the description of the structures of the semiconductor substrate 314, the dielectric layers 316 and 318, the conductive wires 332a-332e and 334a-334b, the through electrode 312 and the interconnect 330 is omitted for brevity.

Figure 4:
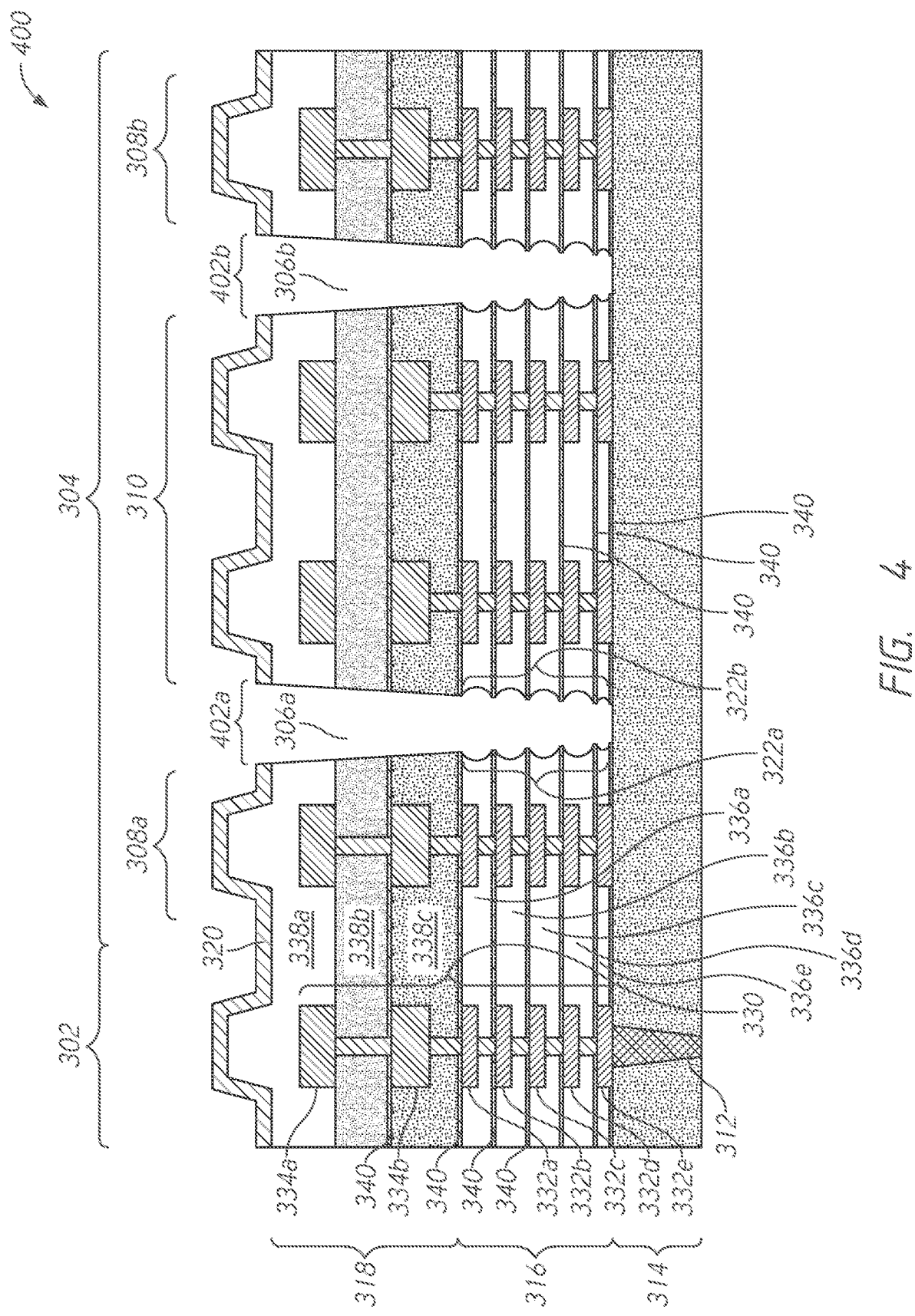
FIG. 4 is a diagram of vertical cross-sectional views of one schematic structure of a portion of a semiconductor device in accordance with an embodiment of the present disclosure.

FIG. 4 is a diagram of a vertical cross-sectional view of one schematic structure of a portion 400 of a semiconductor device 100 in accordance with an embodiment of the present disclosure. FIG. 4 may be a cross-sectional view of the portion 400 of the semiconductor device 100 after etching for formation of grooves 306a and 306b in FIG. 3. The grooves 306a and 306b may be formed by photolithography and etching. Before etching processes (not shown), cut regions 402a and 402b may include the semiconductor substrate 314, the dielectric layers 316 and 318 and a cover layer 320. For example, one of the dielectric layers 340 may be formed on the semiconductor substrate 314. Each of the dielectric layers 316, such as dielectric films 336a-336e including low-k material, and each of dielectric layers 338 may be formed repeatedly in turn while conductive wires 332a-332e and through electrodes coupling the conductive wires 332a-332e may be formed through the dielectric layers 316 and the dielectric layers 340. In some embodiments, the dielectric layers 316 including low-k material films are formed by a chemical vapor deposition (CVD) method, for example. Dielectric layers 318, such as dielectric layers 318 including silicon dioxide (SiO2) may be formed repeatedly while conductive wire 334a and 334b and through electrodes coupling the conductive wire 334a to the conductive wire 334b may be formed through the dielectric layers 318. The cover layer 320 may be formed on the dielectric film 338a at the top of the dielectric layers 318. In some embodiments, the sub region 302 and the circuit edge 308a of the dielectric film 338a including the wire 334a may have a thickness greater than regions of the dielectric film 338a between the sub region 302 and the circuit edge 308a. In some embodiments, some regions in the scribe center region 310 including wires and interconnects may have a thickness greater than a center region including a dicing line between the regions including the interconnects. The thicker portions of the dielectric film 338a may provide support for the portion 400 including interconnect 330, suppressing cracks around the interconnects 330 in the sub region 302 and the regions including interconnects in the scribe center region 310. In order to form the grooves 306a and 306b by etching, photographic processes can be used to provide patterns of grooves 306a and 306b on the cover layer 320. A photoresist (not shown) may be disposed on the cover layer 320 on the circuit regions 108 and the circuit edges 308a and 308b and the scribe center region 310 of the scribe region 304. The cover layer 320 in the cut regions 402a and 402b may not be covered by the photoresist and thus may be exposed for etching. Etching may be dry etching or wet etching. Thus, the dielectric layers 316, 318, and the cover layer 320 in the cut regions 402a and 402b may be removed and the grooves 306a and 306b may be formed in the cut regions 402a and 402b. In some embodiments, etching may be performed until the etching is stopped by the semiconductor substrate 314. Thus, the grooves 306a and 306b may be disposed on or above the semiconductor substrate 314. The photoresist on the cover layer 320 may be removed, and the cover layer 320 on the sub region 302, circuit edges 308a and 308b and the scribe center region 310 may be exposed. The groove 306a may have edge surfaces including portions 322a and 322b of the dielectric films 336a-336e facing the groove 306a as shown in FIG. 4. The portions 322a and 322b may be caused during the etching and post-etching processes to remove the photoresist (e.g., dry ashing and wet cleansing).

Figure 5:
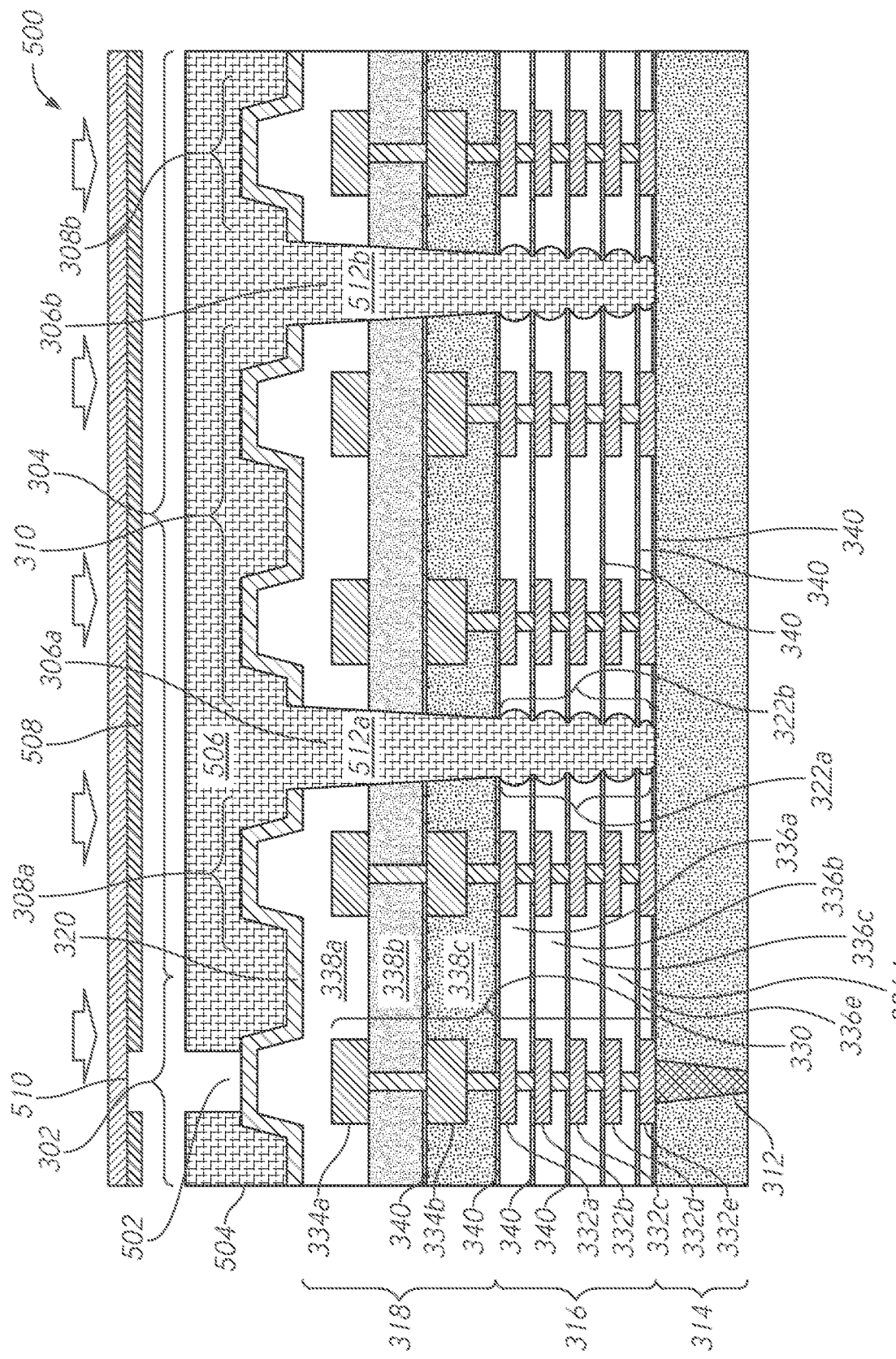
FIG. 5 is a diagram of vertical cross-sectional views of one schematic structure of a portion of a semiconductor device in accordance with an embodiment of the present disclosure.

FIG. 5 is a diagram of a vertical cross-sectional view of one schematic structure of a portion 500 of a semiconductor device 100 in accordance with an embodiment of the present disclosure. FIG. 5 may be a cross-sectional view of the portion 500 of the semiconductor device 100 after polymer 504 may be applied on the cover layer 320 and in the grooves 306a and 306b. Thus, the polymer 504 may cover the entire cover layer 320 and edge surfaces of the dielectric layers 316 and 318 facing the grooves 306a and 306b, respectively, including portions 322a and 322b of the edge surfaces of the dielectric layers 318 facing the groove 306a. In some embodiments, the polymer 504 may be polyimide or phenolic resin. The polymer 504 may be in a liquid form when applied. In some embodiments, the polymer 504 may include a relatively thick film that may be sufficient to fill the grooves 306a and 306b up to top openings of the grooves 306a and 306b. The polymer 504 may be thermally cured into a film 506 over the cover layer 320 and liners 512a and 512b in the grooves 306a and 306b, respectively. The film 506 can be patterned using photolithography. In some embodiments, the polymer 504 may be a positive-tone photoresist that may be removed by exposure to light, such as ultraviolet (UV) light. A mask 508 is provided above the polymer 504. The mask 508 may include an opening 510 above the interconnect 330. The portion 500 may be exposed to light above the mask 508 to transfer the opening 510 to the film 506 in a manner that a hole 502 in the film 506 may be provided above the interconnect 330.

Figure 6:
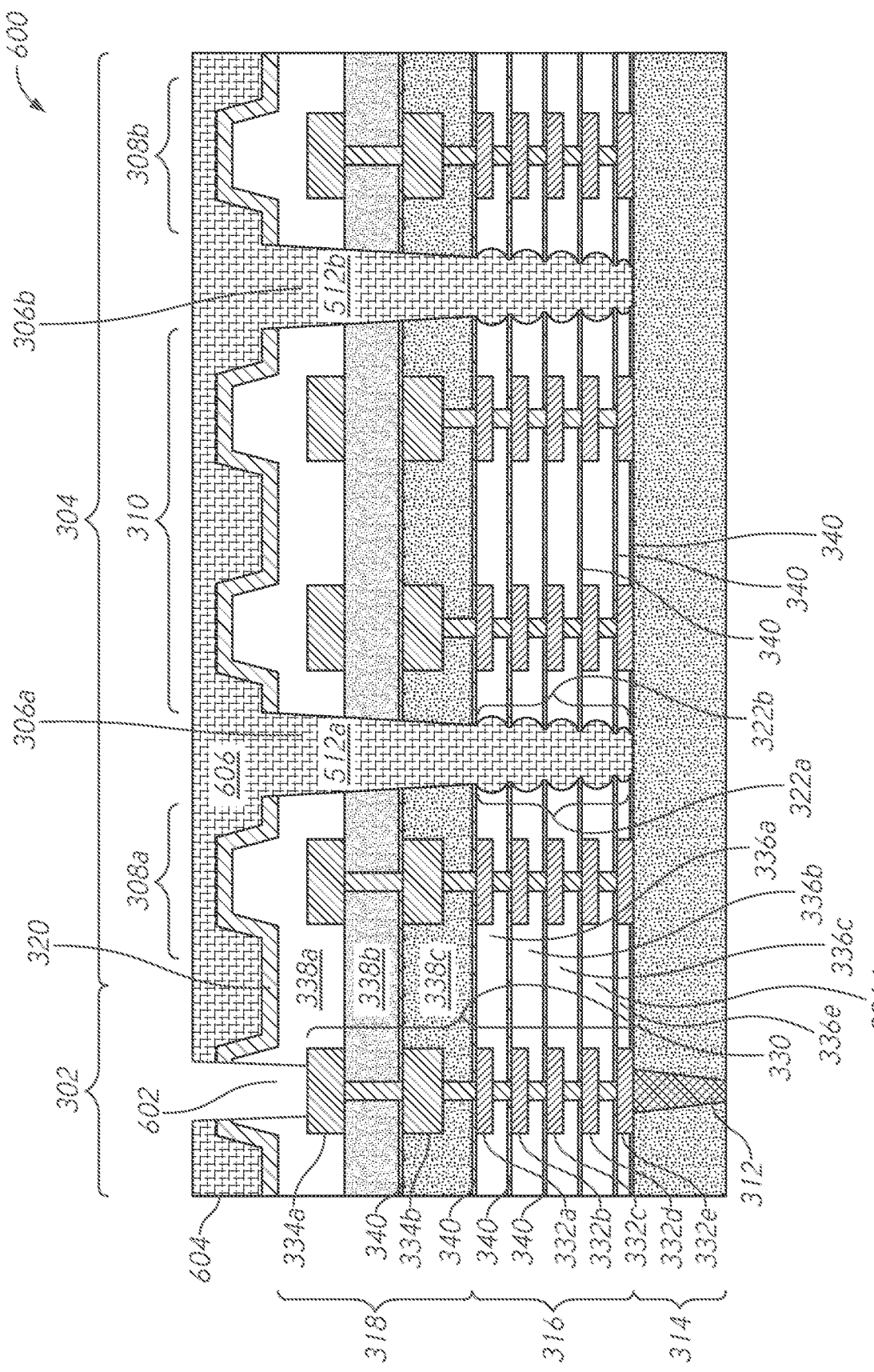
FIG. 6 is a diagram of vertical cross-sectional views of one schematic structure of a portion of a semiconductor device in accordance with an embodiment of the present disclosure.

Removing at least a portion of polymer 504 may be performed. A degree of removal of the portion of polymer 504 may be controlled by adjusting a combination of a thickness of the film 506, conditions of etching (e.g., dry etching) and conditions of oxygen plasma ashing performed in removing the portion of polymer 504. FIG. 6 is a diagram of a vertical cross-sectional view of one schematic structure of a portion 600 of a semiconductor device 100 in accordance with an embodiment of the present disclosure. The film 504 in FIG. 5 may be used as a mask for etching. Etching may be performed through the cover layer 320 and a portion of the dielectric film 338a in the hole 502 in FIG. 5, and a hole 602 may be formed through the dielectric film 338a. In some embodiments, etching may be performed until exposing the conductive wire 334a on an end of the interconnect 330 in the dielectric film 338a. A top portion of the polymer 504 at the top of the film 506 in FIG. 5 may be removed during the etching. The film 606, thinner than the film 506, may remain on the cover layer 320 and the liners 512a and 512b.

Figure 7A:
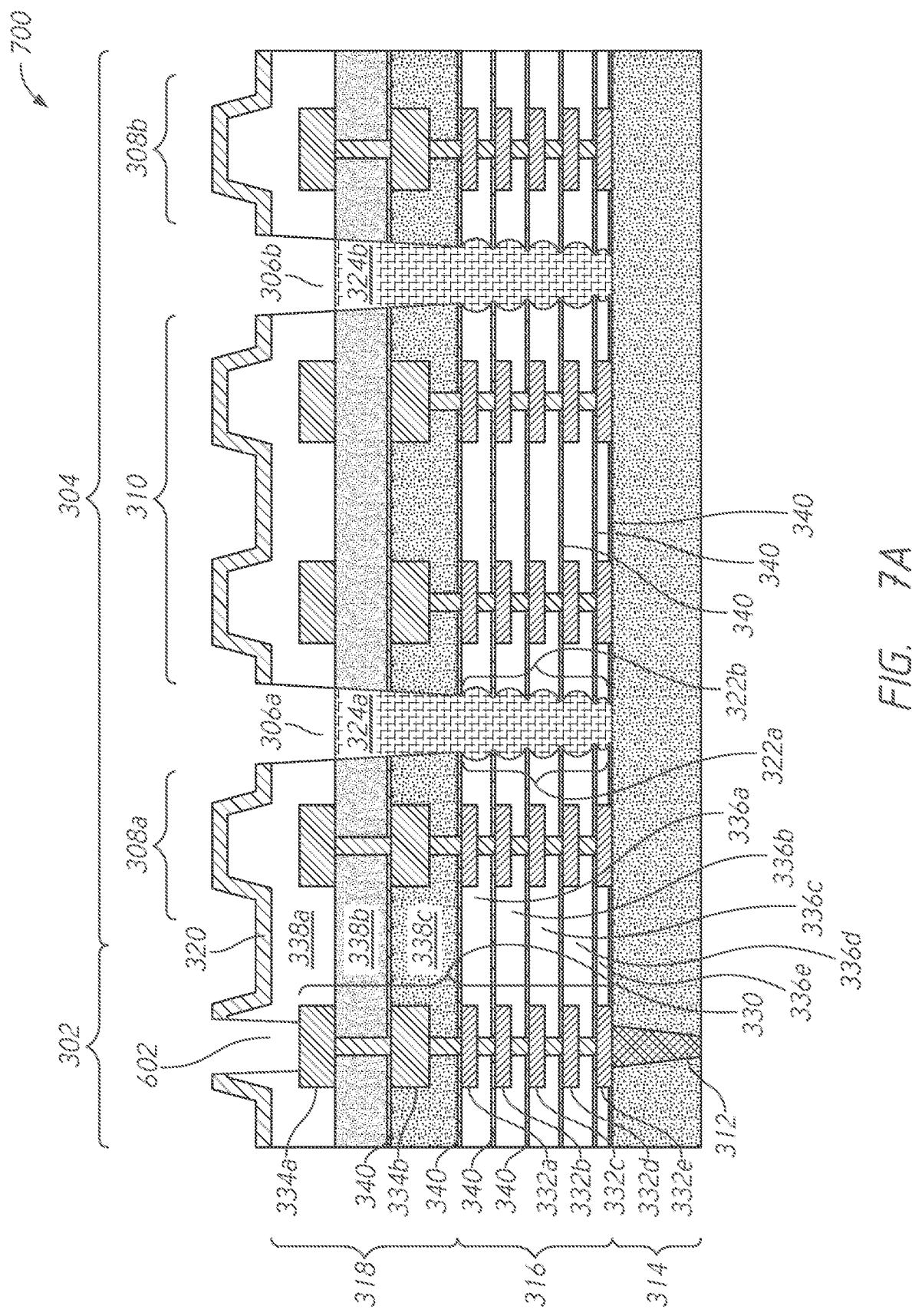
FIG. 7A is a diagram of vertical cross-sectional views of one schematic structure of a portion of a semiconductor device in accordance with an embodiment of the present disclosure.

As mentioned earlier, the degree of removal of the portion of polymer 504 may be controlled by conditions of oxygen plasma ashing. In some embodiments, a period of oxygen plasma ashing may be controlled. FIG. 7A is a diagram of a vertical cross-sectional view of one schematic structure of a portion 700 of a semiconductor device 100 in accordance with an embodiment of the present disclosure. In some embodiments, the film 606 and a top portion of the liners 512a and 512b in the dielectric film 338a may be removed to provide the liners 324a and 324b up to the dielectric film 338b in the grooves 306a and 306b.

Figure 7B:
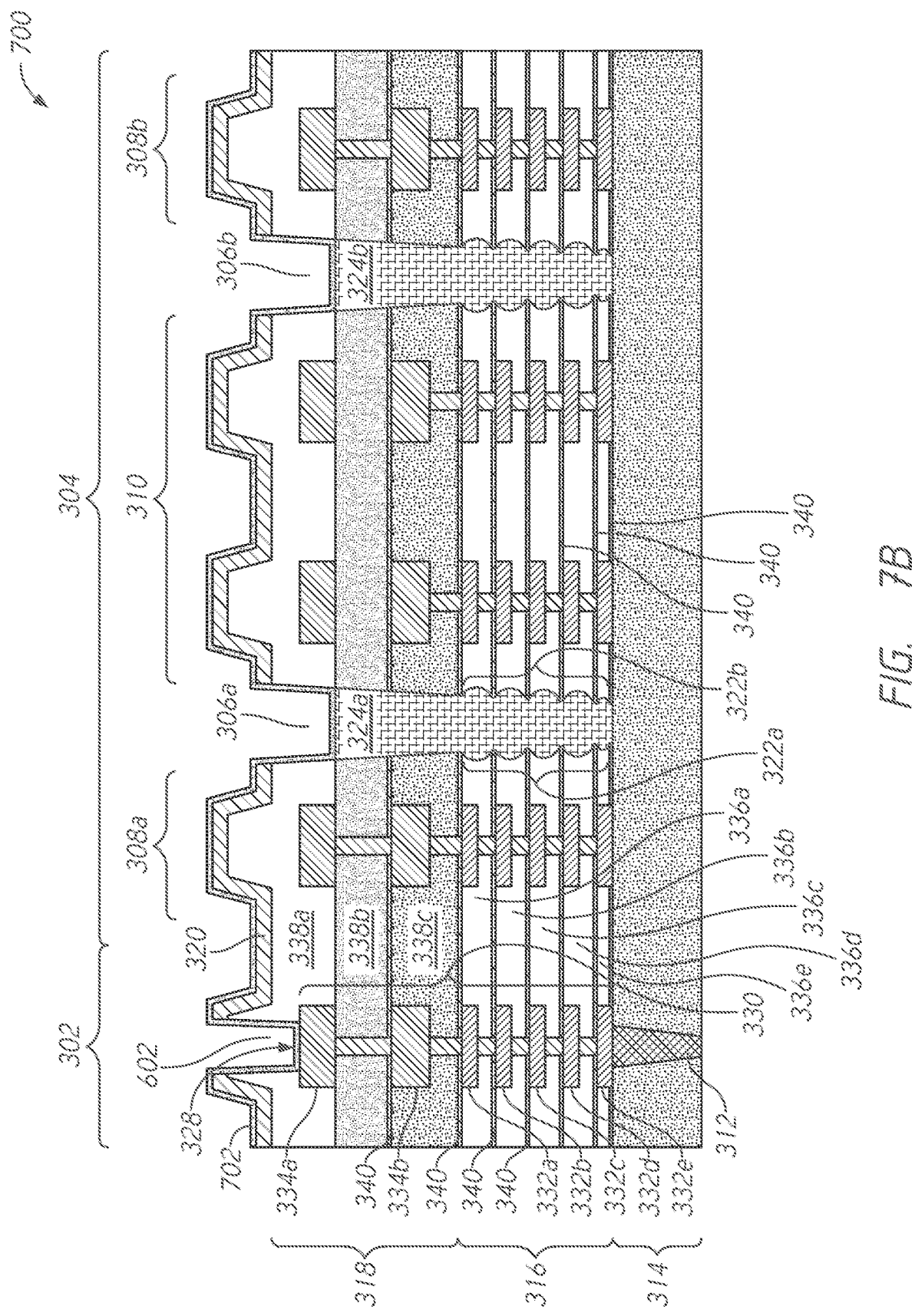
FIG. 7B is a diagram of vertical cross-sectional views of one schematic structure of a portion of the semiconductor device in accordance with an embodiment of the present disclosure.

FIG. 7B is a diagram of a vertical cross-sectional view of one schematic structure of a portion 700 of the semiconductor device 100 in accordance with an embodiment of the present disclosure. After the oxygen plasma ashing, barrier and conductive seed layer 702 may be deposited on the cover layer 320 to cover the cover layer 320, the hole 602 and the grooves 306a and 306b. In some embodiments, the barrier and conductive seed layer 702 may be deposited by a physical vapor deposition (PVD) method, such as sputtering. The barrier and conductive seed layer 702 may include a barrier film and a conductive seed film. The barrier film may include material with corrosion resistance, such as titanium nitride (TiN), for example. The conductive seed film may include copper (Cu) or nickel (Ni), for example. The barrier and conductive seed layer 702 may cover the hole 602, including edge surfaces and bottom of the hole 602. The barrier and conductive seed layer 702 may include the conductive seed layer 328 on the exposed conductive wire 334a at the bottom of the hole 602. As illustrated in FIG. 7B, the dielectric layers 316 and 318 may have edge surfaces facing the grooves 306a and 306b. The portions of the edge surfaces of the dielectric layers 316 and 318, including portions 322a and 322b in the dielectric layers 316, up to the dielectric film 338b may be covered by the liner 324a. The liner 324a may have a top surface continuous with the edge surfaces of the dielectric film 338a facing the groove 306a that is continuous with the cover layer 320. The top surface of the liner 324a, the edge surfaces of the dielectric film 338a facing the groove 306a and the top surface of the cover layer 320 may be covered by the barrier and conductive seed layer 702. Because the liner 324a covers the portions 322a and 322b, the barrier and conductive seed layer 702 may be deposited on a top surface of the portion 700 in a continuous and seamless manner. Thus, the conductive pillar 326 in FIG. 3 may be successfully formed by electroplating on the conductive seed layer 328.

Figure 8A:
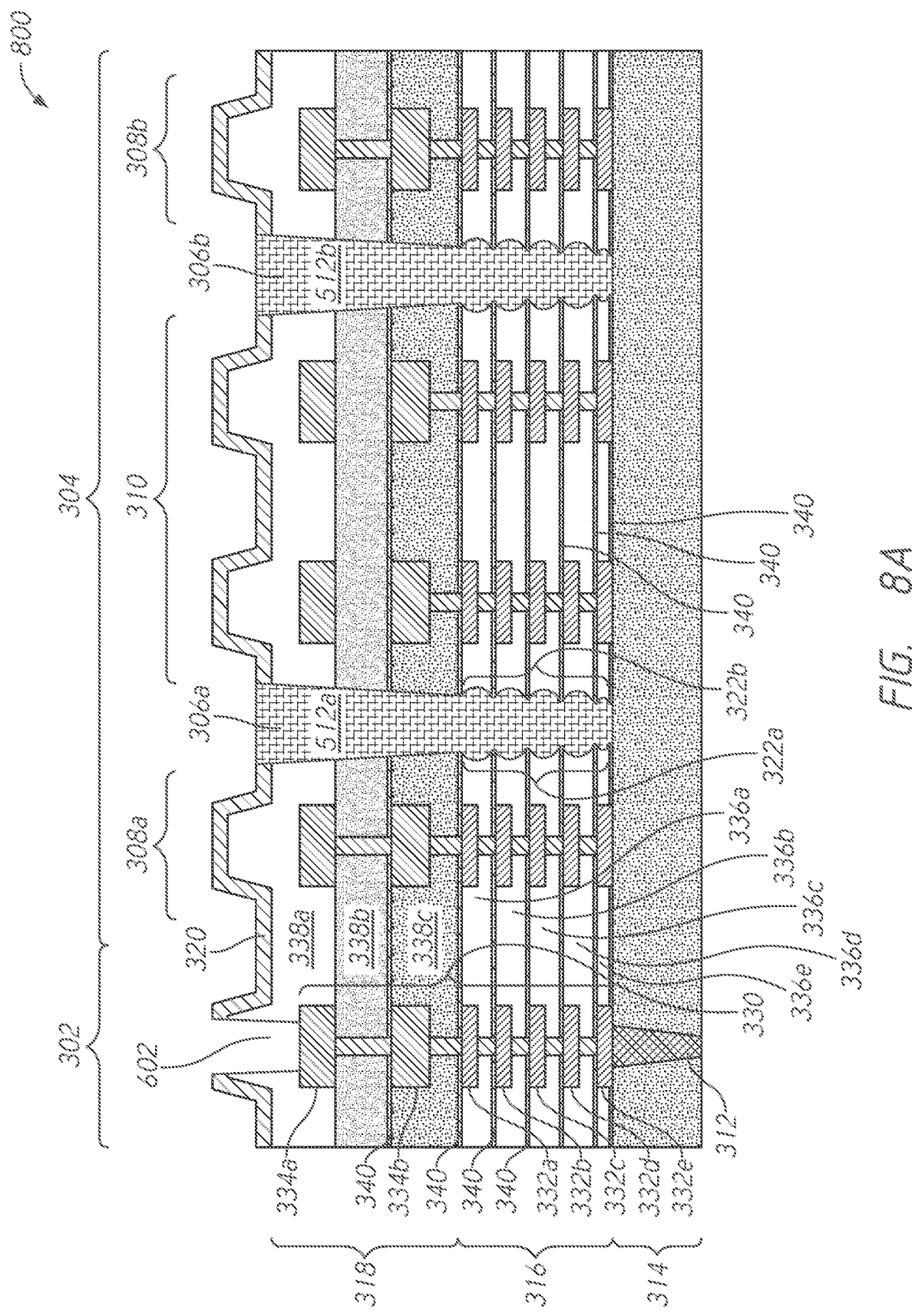
FIG. 8A is a diagram of vertical cross-sectional views of one schematic structure of a portion of a semiconductor device in accordance with an embodiment of the present disclosure.

FIG. 8A is a diagram of a vertical cross-sectional view of one schematic structure of a portion 800 of a semiconductor device 100 in accordance with an embodiment of the present disclosure. In some embodiments, the film 606 may be removed to provide liners 512a and 512b that fill the grooves 306a and 306b to an upper surface of the cover layer 320. As a result, top surfaces of the liners 512a and 512b may be continuous with the cover layer 320. Top surfaces of the liners 512a and 512b may be continuous with the cover layer 320.

Figure 8B:
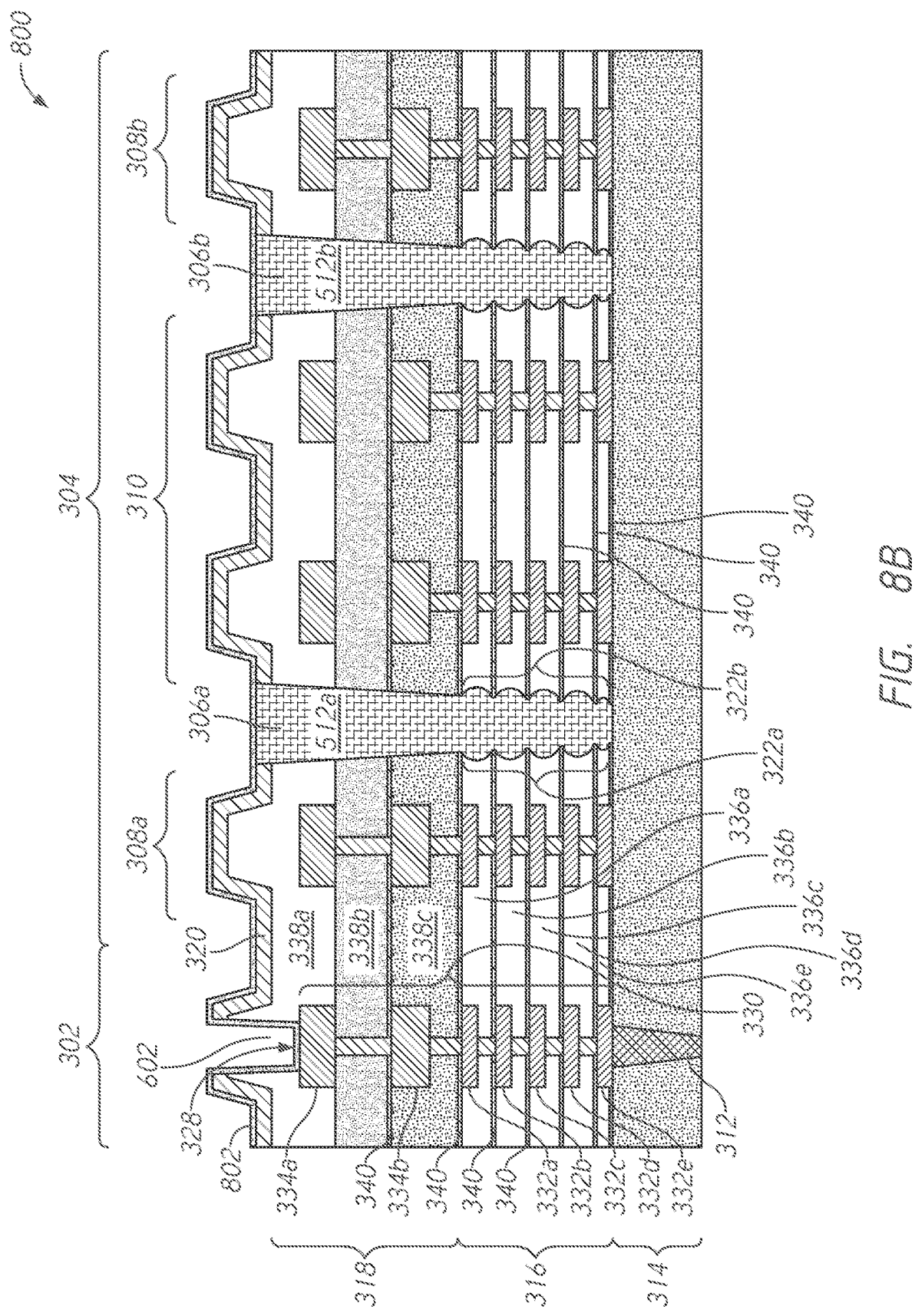
FIG. 8B is a diagram of vertical cross-sectional views of one schematic structure of a portion of the semiconductor device in accordance with an embodiment of the present disclosure.

FIG. 8B is a diagram of a vertical cross-sectional view of one schematic structure of a portion 800 of the semiconductor device 100 in accordance with an embodiment of the present disclosure. After the oxygen plasma ashing, barrier and conductive seed layer 802 may be deposited on the cover layer 320 to cover the cover layer 320, the hole 602 and the liners 512a and 512b. In some embodiments, the barrier and conductive seed layer 802 may be deposited by a physical vapor deposition (PVD) method, such as sputtering. The barrier and conductive seed layer 802 may include a barrier film and a conductive seed film, similarly to the barrier and conductive seed layer 702 in FIG. 7B. The barrier and conductive seed layer 802 may cover the hole 602, including edge surfaces and bottom of the hole 602. The barrier and conductive seed layer 802 may include the conductive seed layer 328 on the exposed conductive wire 334a at the bottom of the hole 602. As illustrated in FIG. 8B, the edge surfaces in the groove 306a up to the level of the cover layer 320 including portions 322a and 322b, may be covered by the liner 512a. Because the liners 512a and 512b cover the portions 322a and 322b, the barrier and conductive seed layer 802 may be deposited on a top surface of the portion 800 in a continuous and seamless manner. Thus, the conductive pillar 326 in FIG. 3 may be successfully formed by electroplating on the conductive seed layer 328.

Figure 9A:
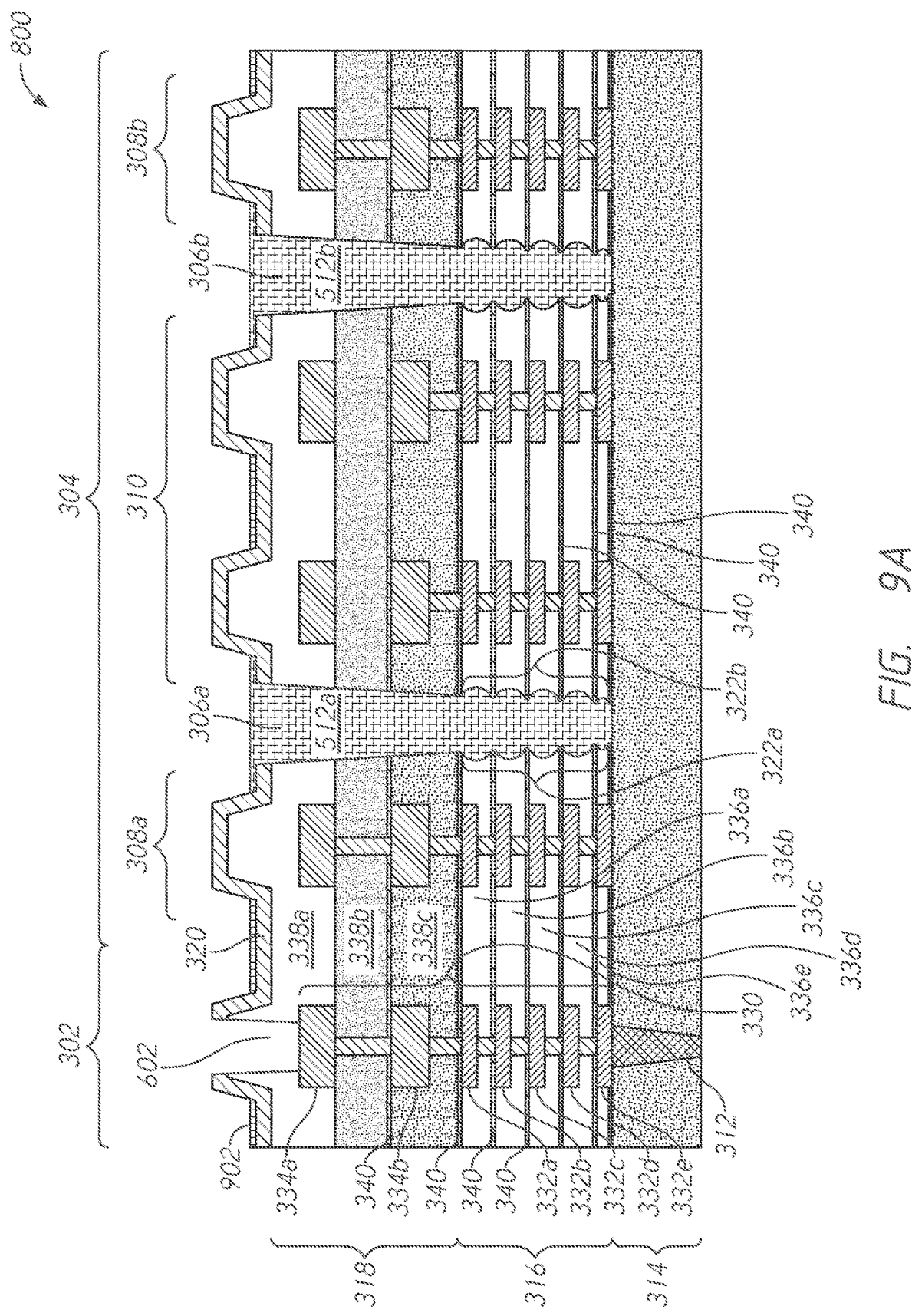
FIG. 9A is a diagram of vertical cross-sectional views of one schematic structure of a portion of a semiconductor device in accordance with an embodiment of the present disclosure.

FIG. 9A is a diagram of a vertical cross-sectional view of one schematic structure of a portion 900 of a semiconductor device 100 in accordance with an embodiment of the present disclosure. In some embodiments, a top portion of the film 606 may be removed by oxygen plasma ashing for a shorter period relative to the periods of oxygen plasma ashing performed for the portions 700 and 800. Thus a remaining portion 902 of the film 606 may be provided. The bottom portion 902 of the film 606 may be on the cover layer 320 above a thin portion of the dielectric film 338a between the circuit edge 308a and the hole 602. The bottom portion 902 of the film 606 may remain on the liners 512a and 512b. The bottom portion 902 may be thin and not an obstacle for the dicing step.

Figure 9B:
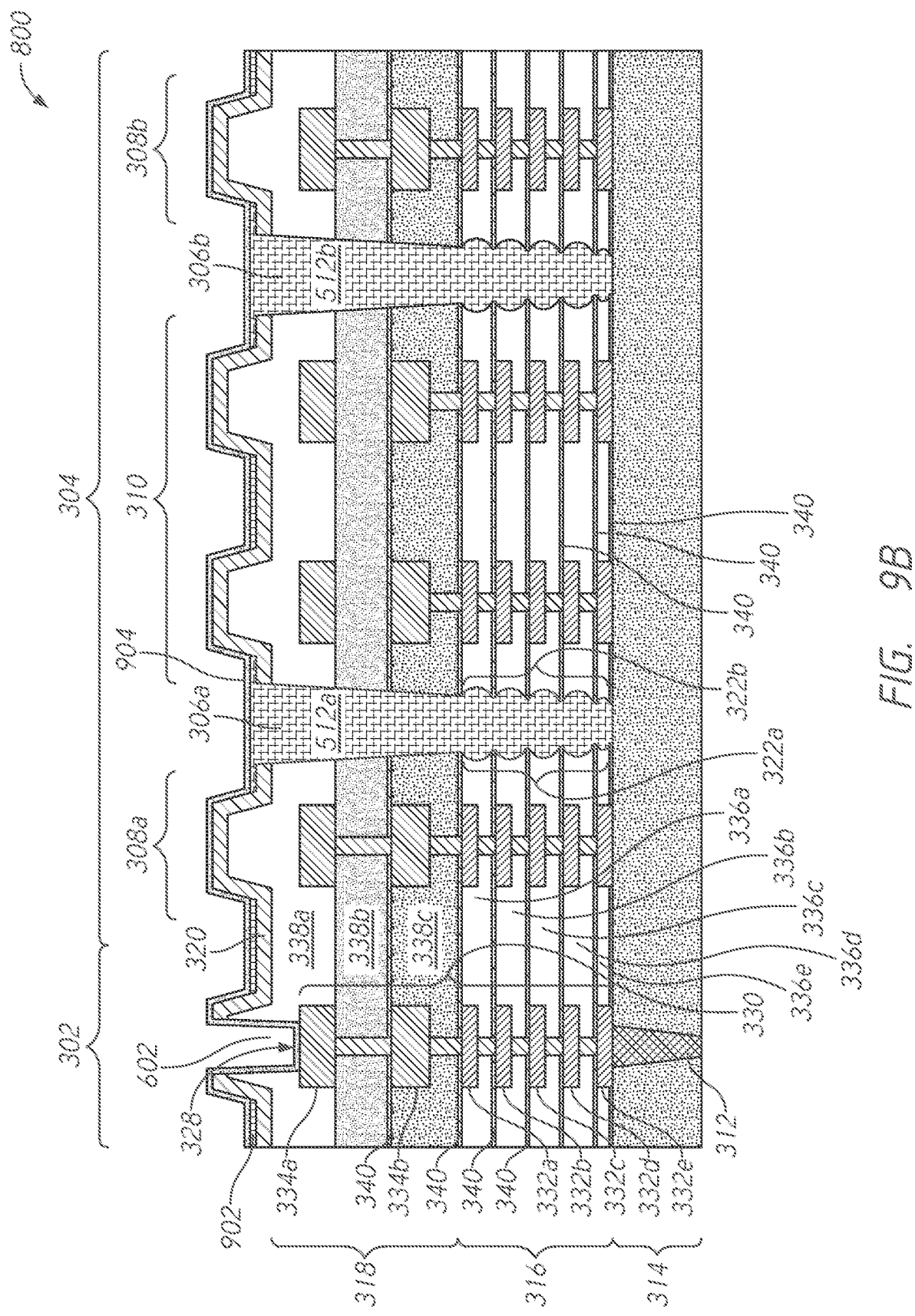
FIG. 9B is a diagram of vertical cross-sectional views of one schematic structure of a portion of the semiconductor device in accordance with an embodiment of the present disclosure.

FIG. 9B is a diagram of a vertical cross-sectional view of one schematic structure of a portion 900 of the semiconductor device 100 in accordance with an embodiment of the present disclosure. After the oxygen plasma ashing, barrier and conductive seed layer may be deposited on the cover layer 320 to cover the cover layer 320, the hole 602 and the liners 512a and 512b. In some embodiments, the barrier and conductive seed layer 904 may be deposited by a physical vapor deposition (PVD) method, such as sputtering. The barrier and conductive seed layer 904 may include a barrier film and a conductive seed film, similarly to the barrier and conductive seed layers 702 and 802. The barrier and conductive seed layer 904 may cover the hole 602, including edge surfaces and bottom of the hole 602. The barrier and conductive seed layer 904 may include the conductive seed layer 328 on the exposed conductive wire 334a at the bottom of the hole 602. As illustrated in FIG. 9B, the edge surfaces of the dielectric layers 316 and 318 in the groove 306a up to the level of the cover layer 320 including portions 322a and 322b, may be covered by the liner 512a. Because the liners 512a and 512b cover the portions 322a and 322b, the barrier and conductive seed layer 904 may be deposited on a top surface of the portion 900 in a continuous and seamless manner. Thus, the conductive pillar 326 in FIG. 3 may be successfully formed by electroplating on the conductive seed layer 328.

In some embodiments, liners including polymer may cover edge surfaces of lower dielectric films (e.g., low-k films) facing grooves without covering edge surfaces of upper dielectric films in the grooves above the lower dielectric films. The edge surfaces of lower dielectric films may have roughness. The edge surfaces of lower dielectric films may have concave portions, for example. In another example, the edge surfaces of lower dielectric films may be uneven.

Figure 10:
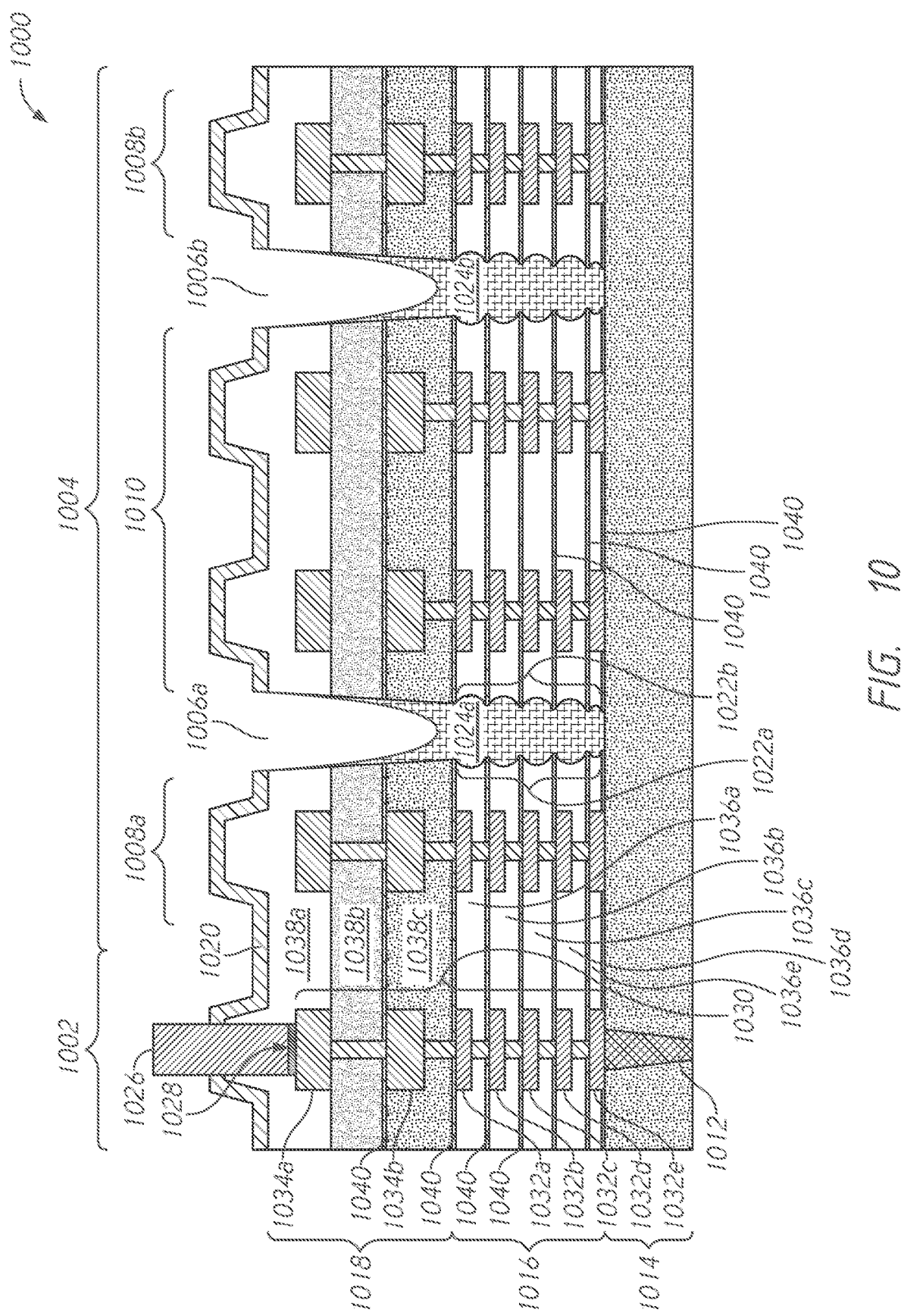
FIG. 10 is a diagram of vertical cross-sectional views of one schematic structure of a portion of a semiconductor device in accordance with an embodiment of the present disclosure.

FIG. 10 is a diagram of vertical cross-sectional views of one schematic structure of a portion 1000 of a semiconductor device 100 in accordance with an embodiment of the present disclosure. In some embodiments, the portion 1000 of the semiconductor device 100 may be a multilayer structure. A semiconductor substrate 1014, dielectric layers 1016 and 1018 and a cover layer 1020 disposed on the semiconductor substrate 1014, a sub region 1002 including conductive wires 1032a-1032e and 1034a-1034b, and an interconnect 1030 coupling a through electrode 1012 to a conductive pillar 1026, a scribe region 1004 including circuit edges 1008a and 1008b, grooves 1006a and 1006b and a scribe center region 1010 in FIGS. 10 to 14 have similar structures as the semiconductor substrate 314, the dielectric layers 316 and 318 and the cover layer 320, the sub region 302 and the scribe region 304 in FIG. 3. Thus the description of the structures of the semiconductor substrate 1014, the dielectric layers 1016 and 1018, the sub region 1002 and the scribe region 1004 is omitted for brevity.

In some embodiments, the portion 1000 of the semiconductor device 100 may include one or more liners 1024a and 1024b disposed in the grooves 1006a and 1006b respectively, that cover at least a portion of edge surfaces of the dielectric layers 1016 and 1018. For example, the liners 1024a and 1024b may include polymer, such as polyimide or phenolic resin. In some embodiments, portions 1022a and 1022b of the edge surfaces of the dielectric layers 1016 in the groove 1006a may include concave portions of the dielectric films 1036a-1036e facing the groove 1006a. The liner 1024a in the groove 1006a may cover the portions 1022a and 1022b.

Processes of providing liners 1024a and 1024b in the grooves 1006a and 1006b and the conductive pillar 1026 of the portion 1000 of the semiconductor device 100 in accordance with an embodiment of the present disclosure will be described with reference to FIGS. 11 to 14.

Figure 11:
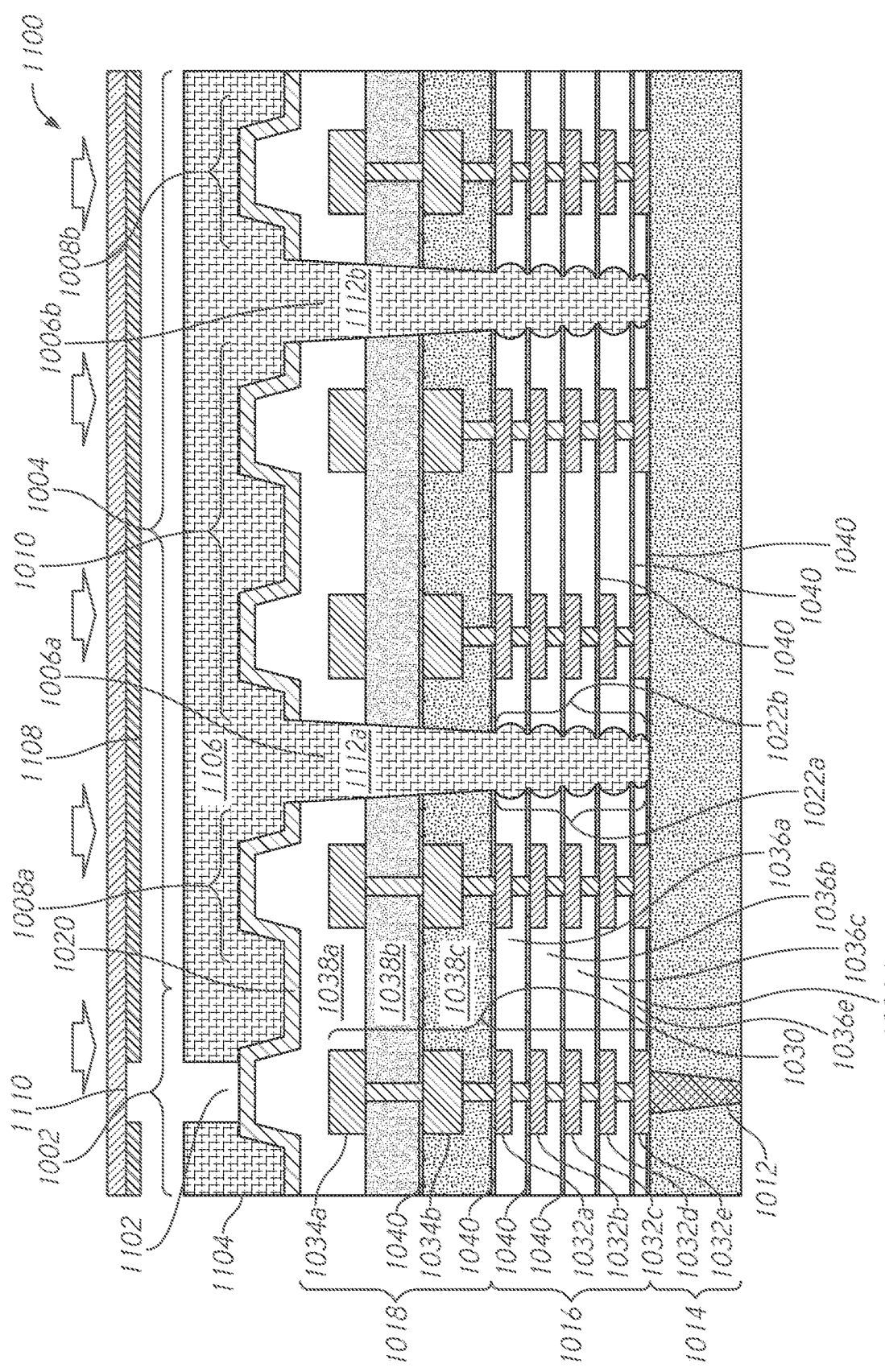
FIG. 11 is a diagram of vertical cross-sectional views of one schematic structure of a portion of a semiconductor device in accordance with an embodiment of the present disclosure.

FIG. 11 is a diagram of a vertical cross-sectional view of one schematic structure of a portion 1100 of a semiconductor device 100 in accordance with an embodiment of the present disclosure. FIG. 11 may be a cross-sectional view of the portion 1100 of the semiconductor device 100 after polymer 1104 may be applied on the cover layer 1020 and in the grooves 1006a and 1006b. Thus, the polymer 504 may cover the entire cover layer 1020 and at least the portion of edge surfaces of the dielectric layers 1016 and 1018, including portions 1022a and 1022b of the groove 1006a. In some embodiments, the polymer 1104 may be polyimide or phenolic resin. The polymer 1104 may be in a liquid form when applied. The grooves 1006a and 1006b may be filled with the polymer 1104 up to top openings of the grooves 1006a and 1006b. The polymer 1104 may be thermally cured into a film 1106 over the cover layer 1020 and liners 1112a and 1112b in the grooves 1006a and 1006b, respectively. The film 1106 can be patterned using photolithography. A mask 1108 is provided above the polymer 1104. The mask 1108 may include an opening 1110 above the interconnect 1030. The portion 1100 may be exposed to light above the mask 1108 to transfer the opening 1110 to the film 1106 in a manner that a hole 1102 in the film 1106 may be provided above the interconnect 1030.

Figure 12:
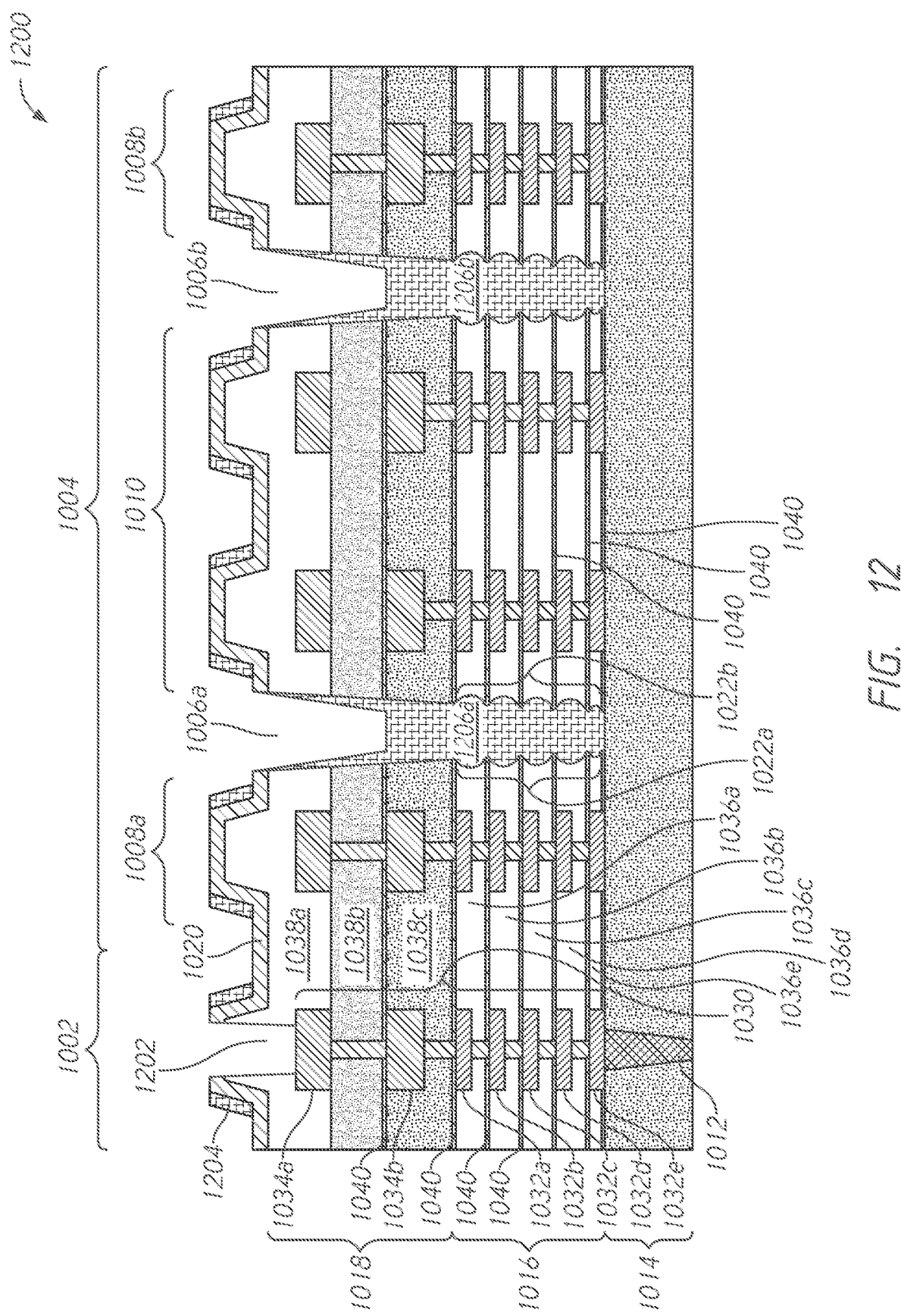
FIG. 12 is a diagram of vertical cross-sectional views of one schematic structure of a portion of a semiconductor device in accordance with an embodiment of the present disclosure.

FIG. 12 is a diagram of a vertical cross-sectional view of one schematic structure of a portion 1200 of a semiconductor device 100 in accordance with an embodiment of the present disclosure. The film 1106 in FIG. 11 may be used as a mask for etching. Etching may be performed through the cover layer 1020 and the dielectric film 1038a in the hole 1102 in FIG. 11, and a hole 1202 may be formed through the dielectric film 1038a. In some embodiments, etching may be performed until exposing the conductive wire 1034a on an end of the interconnect 1030 in the dielectric film 1038a. A top portion of the polymer 1104 at the top of the film 506 in FIG. 5 may be removed during the etching. In some embodiments, a surface portion of the polymer 1104 above the cover layer 1020 and inner portions of the liners 1112a and 1112b in the dielectric films 1038a and 1038b may be removed by etching as well. Thus a portion 1204 on edge surfaces of thick portions of the dielectric film 1038a may remain on the cover layer 1020 together with the liners 1206a and 1206b covering edge surfaces of the grooves 1006a and 1006b. The portion 1204 may be relatively thinner than the film 606.

Figure 13:
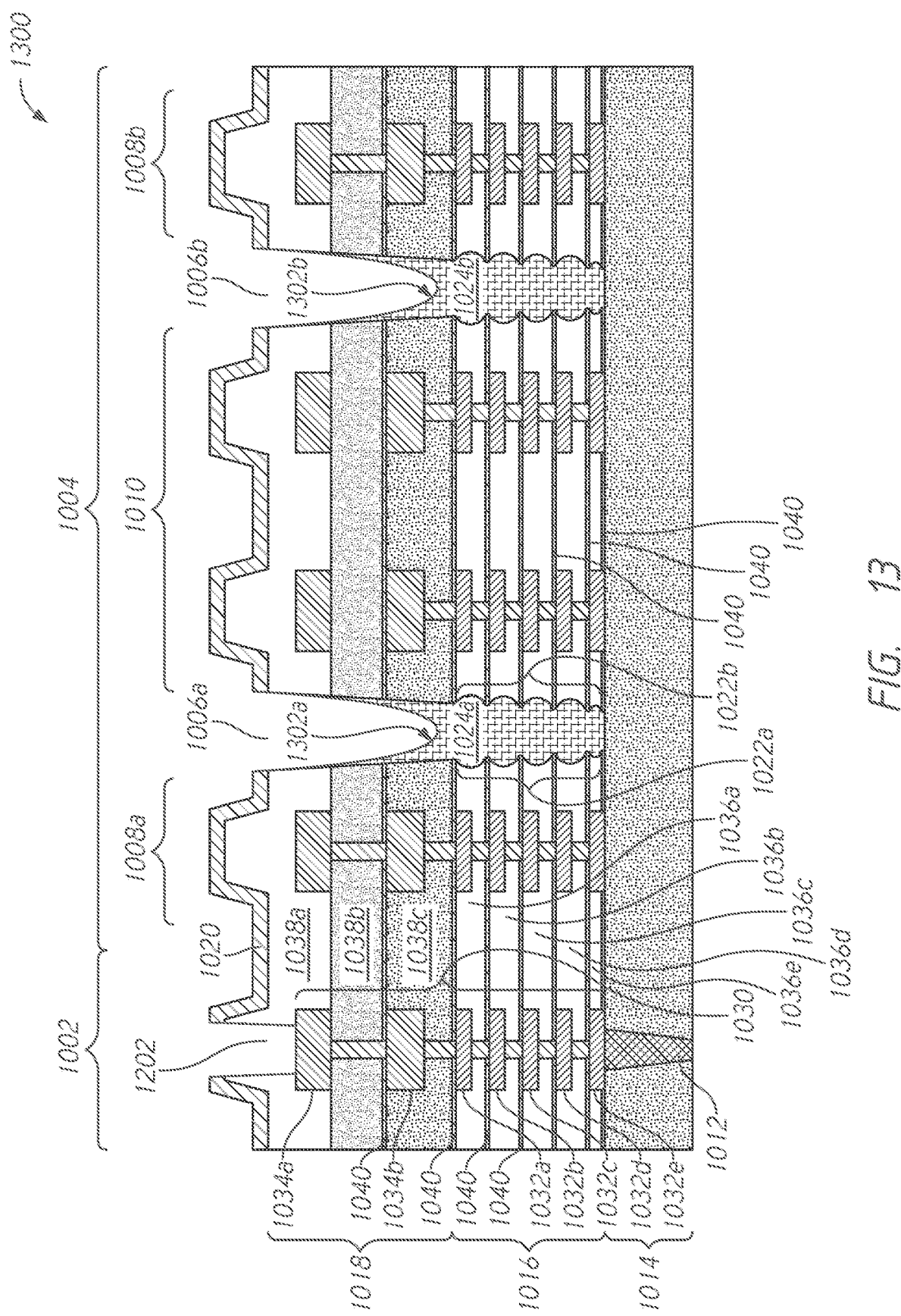
FIG. 13 is a diagram of vertical cross-sectional views of one schematic structure of a portion of a semiconductor device in accordance with an embodiment of the present disclosure.

As mentioned earlier, the degree of removal of the remaining bottom portion 1204 and the liners 1206a and 1206b may be controlled by conditions of oxygen plasma ashing. In some embodiments, a period of oxygen plasma ashing may be controlled. FIG. 13 is a diagram of a vertical cross-sectional view of one schematic structure of a portion 1300 of a semiconductor device 100 in accordance with an embodiment of the present disclosure. In some embodiments, the remaining portion 1204 on the edge surfaces of the thick portions of the dielectric film 1038a above the cover layer 1020 and inner portions of the liners 1206a and 1206b in the dielectric films 1038a and 1038b may be removed during the ashing. Top surfaces 1302a and 1302b of remaining liners 1024a and 1024b may have a U-shape after the inner portion of the dielectric film 1038c may have been removed during the ashing. Thus, the liners 1024a and 1024b on edge surfaces of the dielectric layers 1016 and partially on edge surfaces of the dielectric film 1038c facing the grooves 1006a and 1006b may be formed. In some embodiments, the top surfaces 1302a and 1302b of the remaining liners 1024a and 1024b may be continuous (e.g., without a plurality of concave portions). In some embodiments, the top surfaces 1302a and 1302b of the remaining liners 1024a and 1024b may be smoother than portions 1022a and 1022b of the edge surfaces of the dielectric layers 1016.

Figure 14:
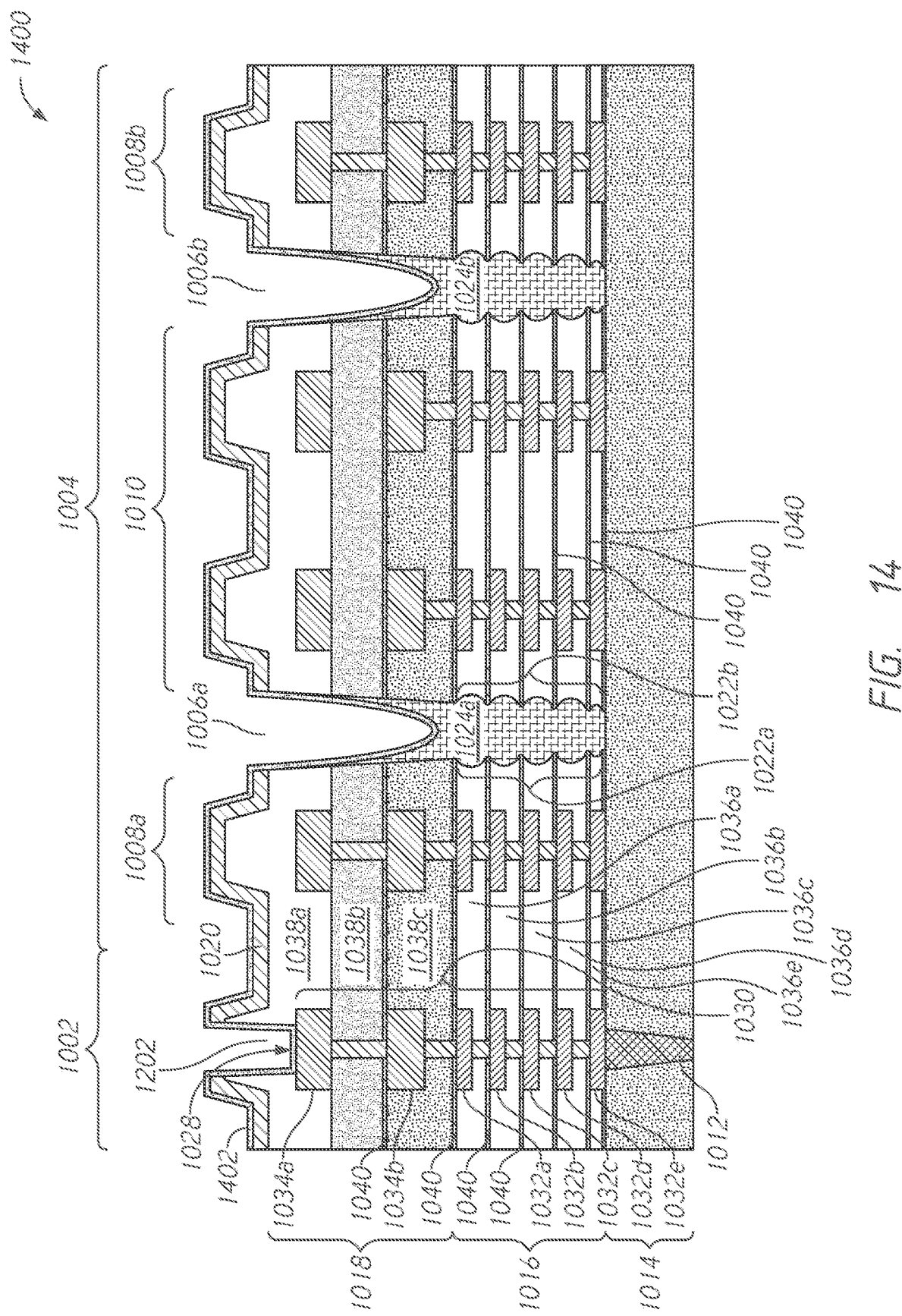
FIG. 14 is a diagram of vertical cross-sectional views of one schematic structure of a portion of a semiconductor device in accordance with an embodiment of the present disclosure.

FIG. 14 is a diagram of a vertical cross-sectional view of one schematic structure of a portion 1400 of a semiconductor device 100 in accordance with an embodiment of the present disclosure. After the oxygen plasma ashing, barrier and conductive seed layer 1402 may be deposited on the cover layer 1020 to cover the cover layer 1020, the hole 1202 and the grooves 1006a and 1006b. Deposition methods and materials of the barrier and conductive seed layer 1402 may be similar to the deposition methods and the materials of the barrier and conductive seed layers 702, 802 and 902, thus the description of the deposition methods and the materials of the barrier and conductive seed layer 1402 is omitted for brevity. The barrier and conductive seed layer 1402 may cover the hole 1202, including edge surfaces and bottom of the hole 1202. The barrier and conductive seed layer 1402 may include the conductive seed layer 1028 on the exposed conductive wire 1034a at the bottom of the hole 1202. As illustrated in FIG. 14, edge surfaces of the dielectric layers 1016 and 1018 in the groove 1006a, including portions 1022a and 1022b, up to the dielectric film 1038b may be covered by the liner 1024a. The liners 1024a and 1024b cover edge surfaces of the dielectric layers 1016 and 1018 in the grooves 1006a and 1006b and provide top surfaces 1302a and 1302b in FIG. 13, on which the barrier and conductive seed layer 1402 may be deposited on a top surface of the portion 1400 in a continuous and seamless manner. Thus, the conductive pillar 1026 in FIG. 10 may be successfully formed by electroplating on the conductive seed layer 1028.

In some embodiments, liners including polymer may cover edge surfaces of upper dielectric films and lower dielectric films (e.g., low-k films) including concave portions. The edge surfaces of lower dielectric films may have roughness. The edge surfaces of lower dielectric films may have concave portions, for example. In another example, the edge surfaces of lower dielectric films may be uneven.

Figure 15:
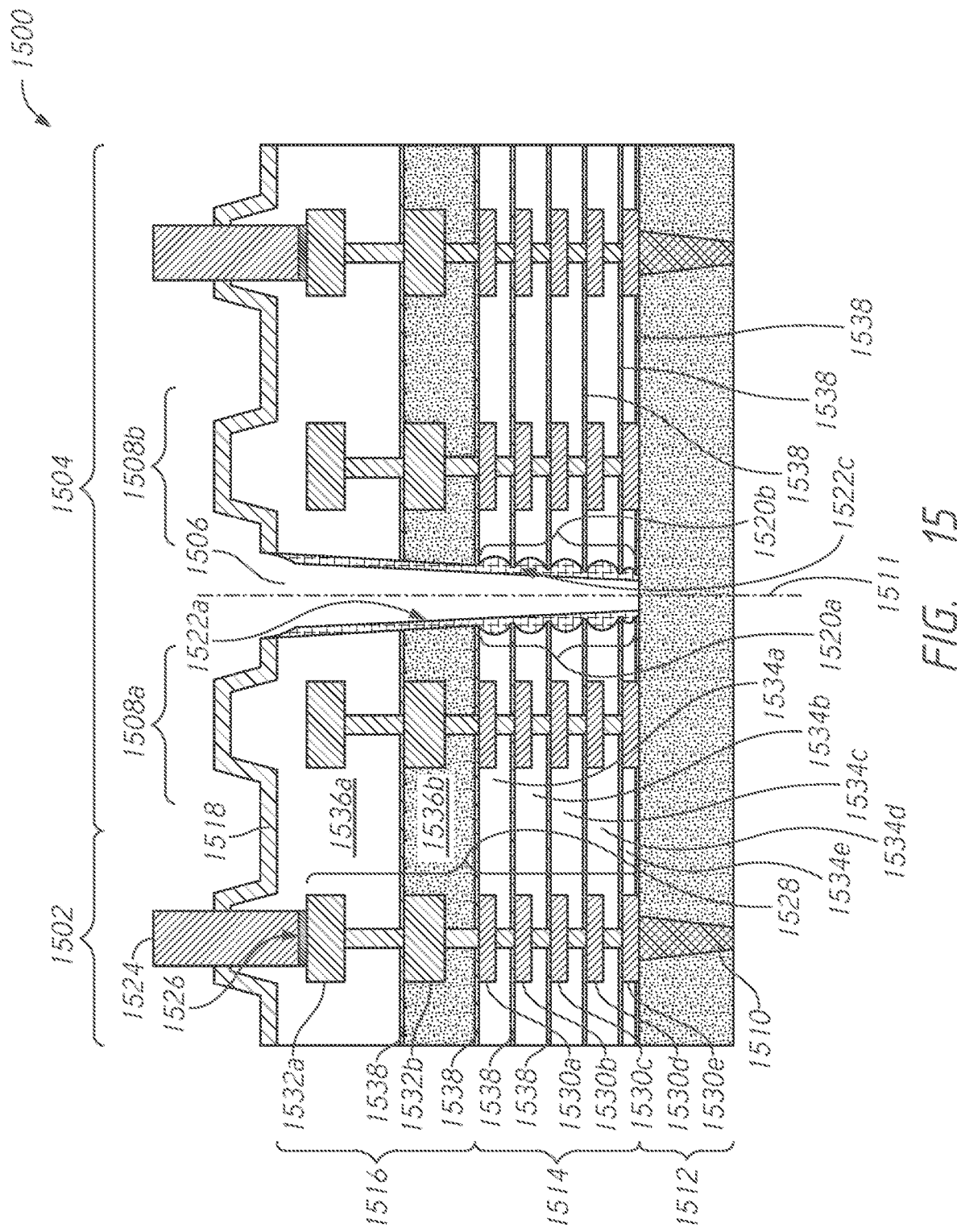
FIG. 15 is a diagram of vertical cross-sectional views of one schematic structure of a portion of a semiconductor device in accordance with an embodiment of the present disclosure.

FIG. 15 is a diagram for diagrams illustrating vertical cross-sectional views of one schematic structure of a portion 1500 of a semiconductor device 100 in accordance with an embodiment of the present disclosure. In some embodiments, the portion 1500 of the semiconductor device 100 may be a multilayer structure. The portion 1500 may omit a scribe center region, and a dicing line 1511 may be included in a groove 1506 as shown in FIG. 2B. Structures shown in FIG. 15 may be similar to structures previously described with reference to and shown in FIG. 3. For example, a semiconductor substrate 1512, dielectric layers 1514 and 1516 and a cover layer 1518 disposed on the semiconductor substrate 1512, a sub region 1502 including conductive wires 1530a-1530e and conductive wire 1532a-1532b and an interconnect 1528 coupling a through electrode 1510 to a conductive pillar 1524, a scribe region 1504 including circuit edges 1508a and 1508b, a groove 1506 between the circuit edges 1508a and 1508b in FIGS. 10 to 14 may have similar structures as the semiconductor substrate 314, the dielectric layers 316 and 318 and the cover layer 320, the sub region 302 and the scribe region 304 in FIG. 3. However, a scribe center region is not included between the circuit edges. Thus the description of the structures of the semiconductor substrate 1512, the dielectric layers 1514 and 1516, the sub region 1502 and the scribe region 1504 is omitted for brevity.

In some embodiments, the portion 1500 of the semiconductor device 100 may include one or more liners 1522a and 1522b disposed on edge surfaces of dielectric layers 1514 and 1516 facing the groove 1506 that cover a portion of the dielectric layers 1514 and 1516 facing the groove 1506. For example, the liners 1522a and 1522b may include polymer, such as polyimide or phenolic resin. In some embodiments, portions 1520a and 1520b of edge surfaces of the dielectric layers 1514 facing the groove 1506 may include concave portions of the dielectric films 1534a-1534e facing the groove 1506. The liners 1522a and 1522b may at least cover the portions 1520a and 1520b.

Processes of providing the liners 1522a and 1522b in the groove 1506 and the conductive pillar 1524 of the portion 1500 of the semiconductor device 100 in accordance with an embodiment of the present disclosure will be described with reference to FIGS. 16 to 20.

Figure 16:
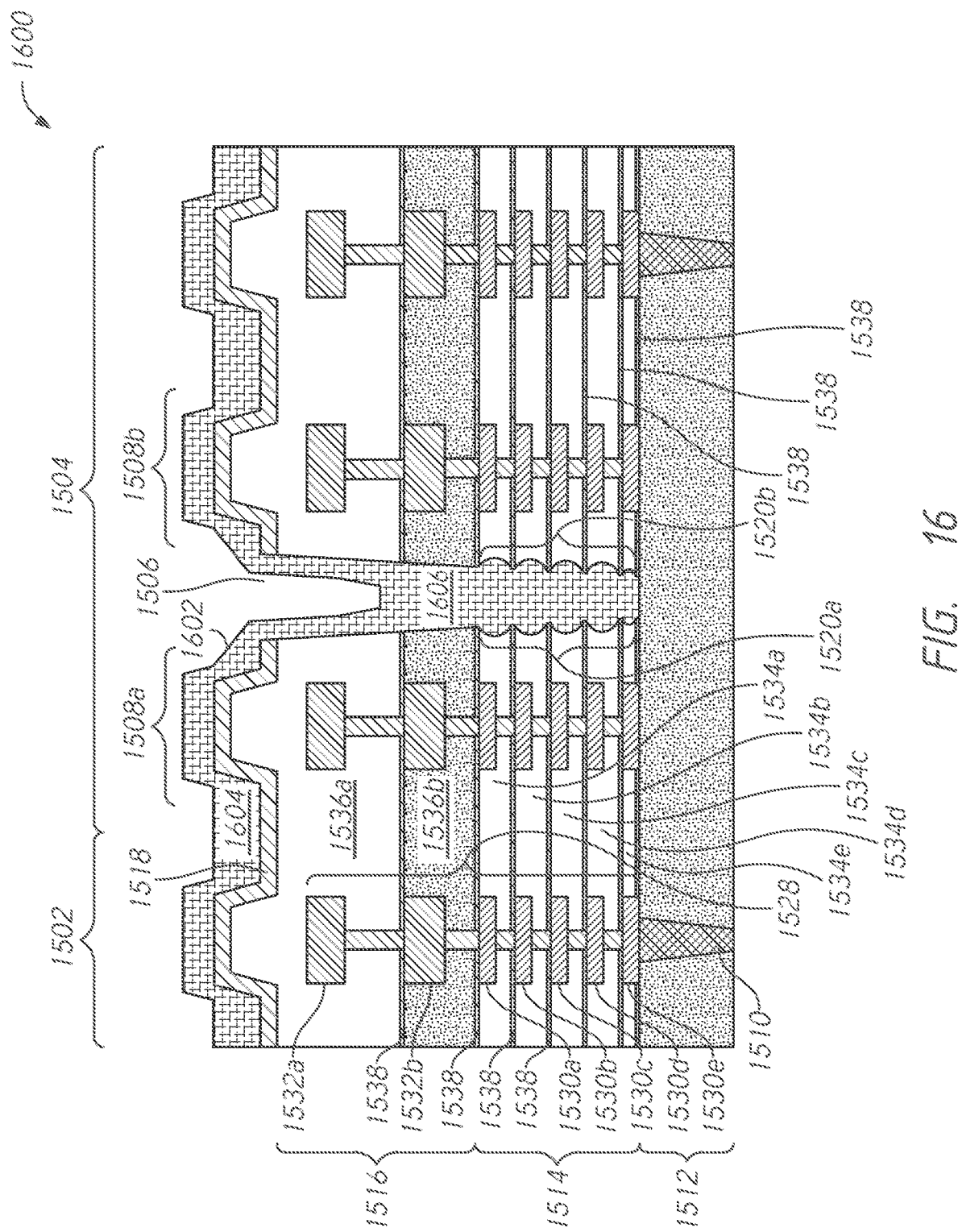
FIG. 16 is a diagram of vertical cross-sectional views of one schematic structure of a portion of a semiconductor device in accordance with an embodiment of the present disclosure.

FIG. 16 is a diagram of a vertical cross-sectional view of one schematic structure of a portion 1600 of a semiconductor device 100 in accordance with an embodiment of the present disclosure. FIG. 16 may be a cross-sectional view of the portion 1600 of the semiconductor device 100 after polymer 1602 may be applied on the cover layer 1518 and in the groove 1506. Thus, the polymer 1602 may cover the entire cover layer 1518 and the edge surfaces of the dielectric layers 1514 and 1516 facing the groove 1506, including portions 1520a and 1520b of the edge surfaces of the dielectric layers 1514 and 1516. In some embodiments, the polymer 1602 may be polyimide or phenolic resin. The polymer 1602 may be in a liquid form when applied. In some embodiments, the polymer 1602 may have relatively lower viscosity compared to the viscosity of the polymer 504 or the polymer 1104, sufficient to cover the edge surfaces of the dielectric layers 1514 and 1516 without filling to a top opening of the groove 1506. For example, the polymer 504 or the polymer 1104 may fill the groove 1506 to below the top opening of the groove 1506. The polymer 1602 may be thermally cured into a film 1604 over the cover layer 1518 and a liner 1606 in the groove 1506.

Figure 17A:
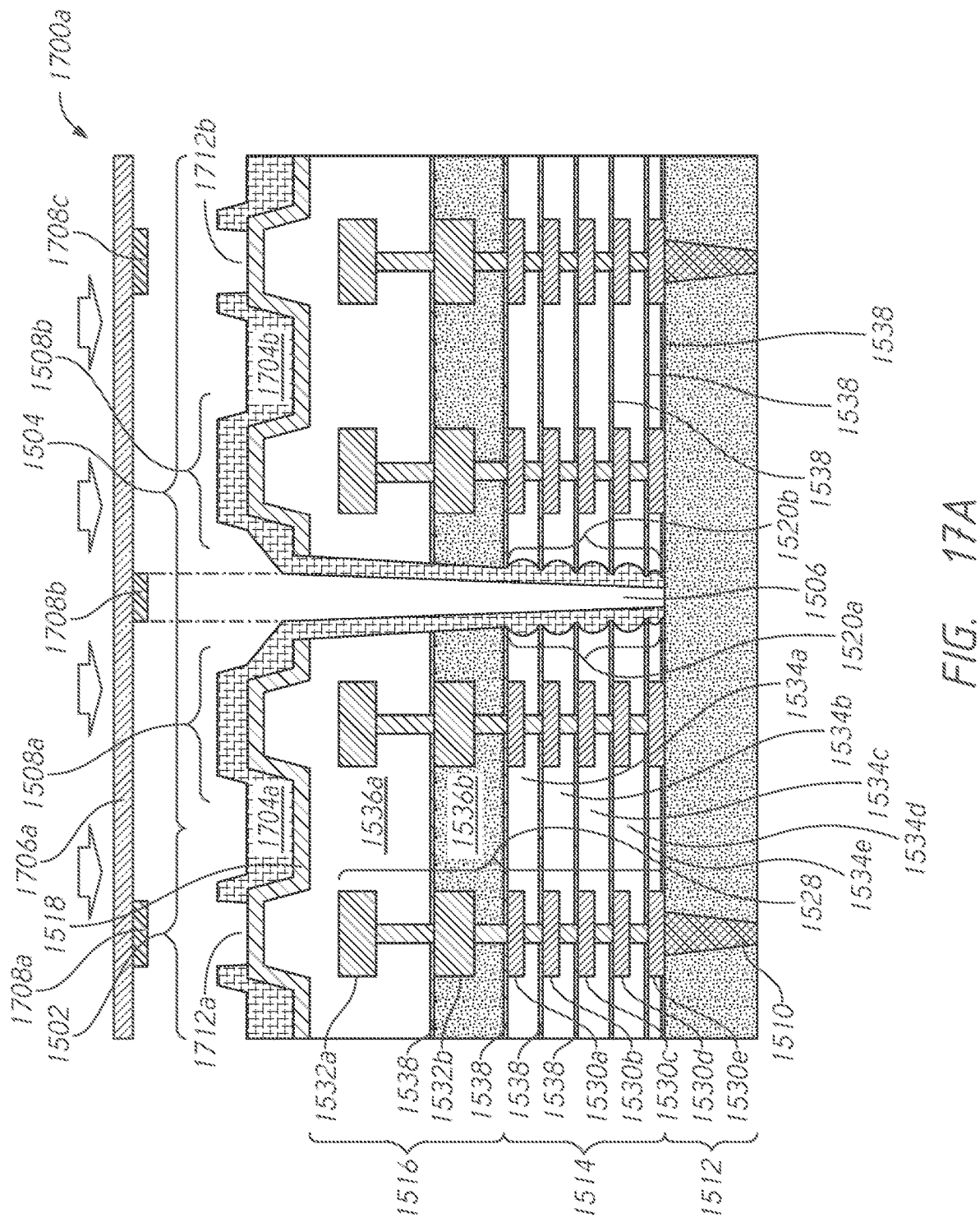
FIG. 17A is a diagram of vertical cross-sectional views of one schematic structure of a portion of a semiconductor device in accordance with an embodiment of the present disclosure.

In some embodiments, the polymer 1602 in FIG. 16 may be a photoresist that can be patterned using photolithography. FIG. 17A is a diagram of a vertical cross-sectional view of one schematic structure of a portion 1700a of a semiconductor device 100 in accordance with an embodiment of the present disclosure. In some embodiments, the polymer 1602 in FIG. 16 may be a photoresist that can be patterned using photolithography. In some embodiments, the polymer 1602 may be a negative-tone photoresist that may be polymerized by exposure to light, such as ultraviolet (UV) light which may not be removed. A mask 1706a is provided above the polymer 1602. The mask 1706a may include masking portions 1708a, 1708b and 1708c above convex potions of a top surface of the polymer 1602, including a portion above the interconnect 1528 and portions above in the circuit edges 1508a and 1508b. The polymer 1602 may be exposed to light from above the mask 1706a except portions of the polymer 1602 under the masking portions 1708a, 1708b and 1708c. After the UV light exposure, the exposed portion of the polymer 1602 may be polymerized. The portion of the polymer 1602 under the masking portion 1708b may be removed to form the groove 1506, and the polymer 1602 may be divided by the groove 1506 to form polymer portions 1704a and 1704b across the groove 1506. The polymer portion 1704a may cover the cover layer 1518 in the circuit edge 1508a and the portion 1520a. The polymer portion 1704b may cover the cover layer 1518 in the circuit edge 1508b and the portion 1520b. The portions of the polymer 1602 under the masking portions 1708a and 1708c may also be removed and holes 1712a and 1712b may be formed under the masking portions 1708a and 1708c.

Figure 17B:
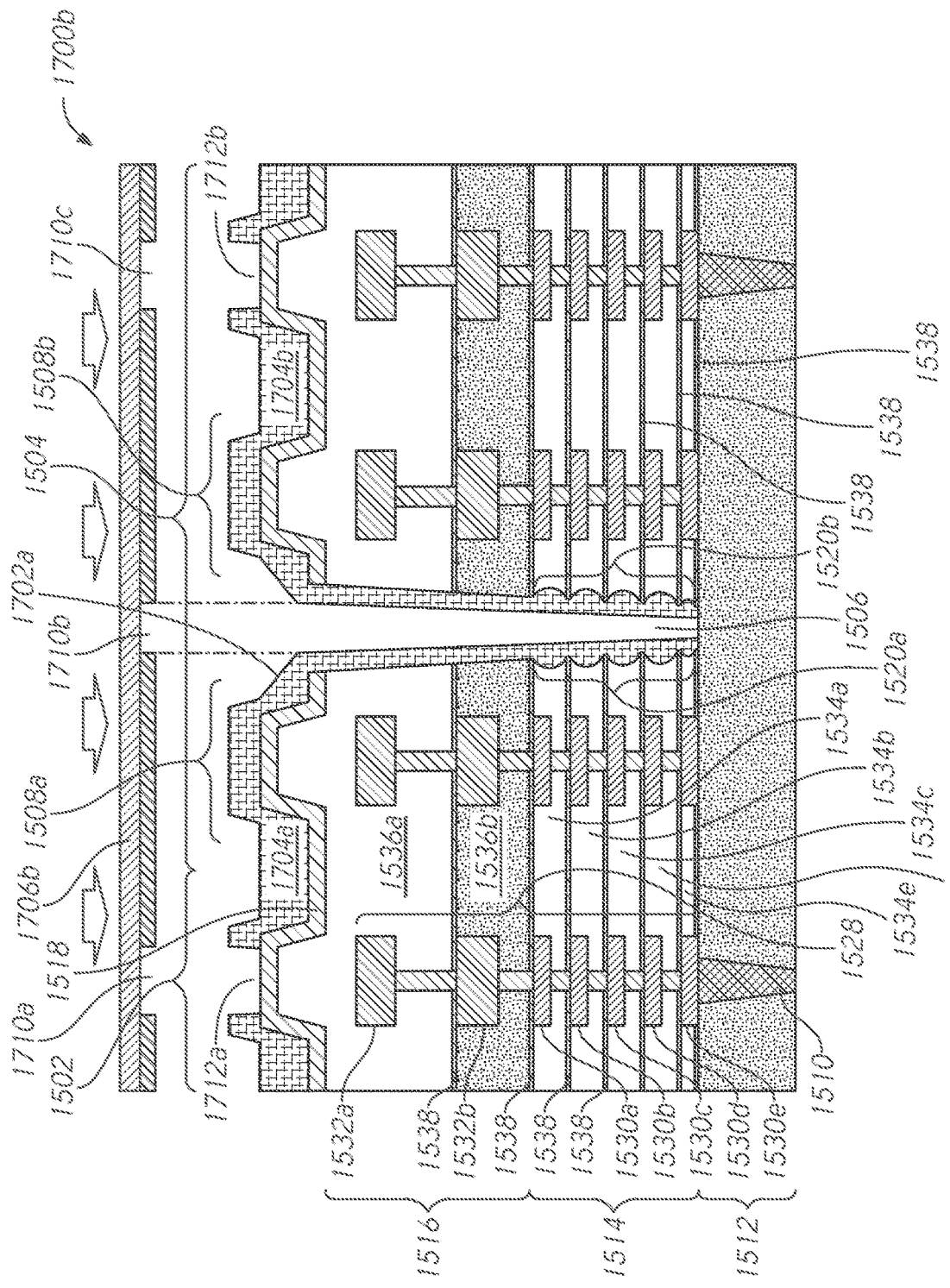
FIG. 17B is a diagram of vertical cross-sectional views of one schematic structure of a portion of a semiconductor device in accordance with an embodiment of the present disclosure.

FIG. 17B is a diagram of a vertical cross-sectional view of one schematic structure of a portion 1700b of a semiconductor device 100 in accordance with an embodiment of the present disclosure. In some embodiments, the polymer 1602 may be a positive-tone photoresist that may be removed by exposure to light, such as ultraviolet (UV) light. A mask 1706b is provided above the polymer 1602. The mask 1706b may include openings 1710a, 1710b and 1710c above convex portions of a top surface of the polymer 1602, including a portion above the interconnect 1528 and portions above in the circuit edges 1508a and 1508b. The polymer 1602 under the openings 1710a, 1710b and 1710c may be exposed to light from above the mask 1706b to transfer the openings 1710a, 1710b and 1710c to the polymer 1602, and the exposed portions of the polymer 1602 under the openings 1710a, 1710b and 1710c may be removed. Thus, a hole 1712a, the groove 1506 and a hole 1712b may be created under the openings 1710a, 1710b and 1710c after the UV light exposure. The polymer 1602 may be divided into polymer portions 1704a and 1704b across the groove 1506.

Figure 18:
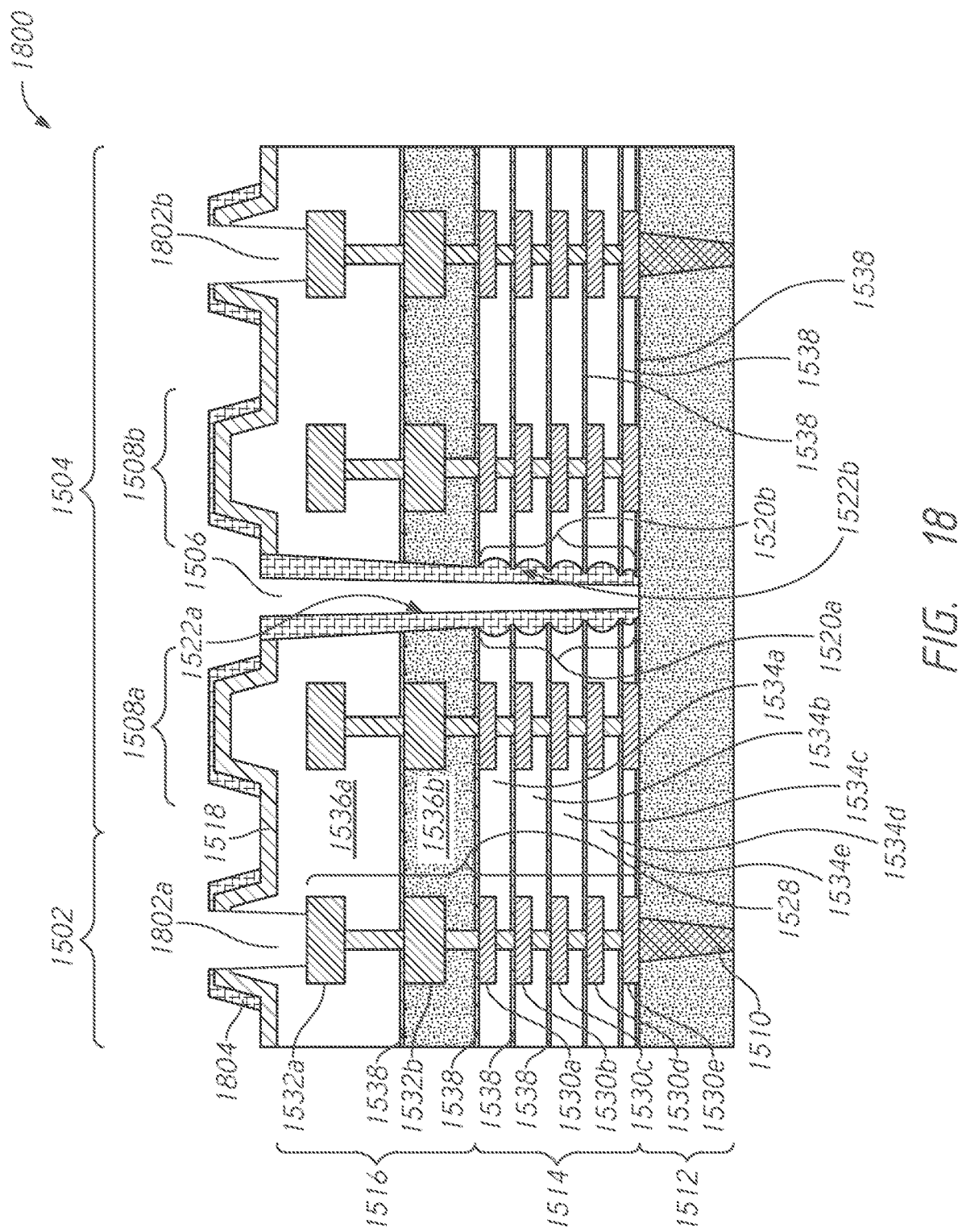
FIG. 18 is a diagram of vertical cross-sectional views of one schematic structure of a portion of a semiconductor device in accordance with an embodiment of the present disclosure.

FIG. 18 is a diagram of a vertical cross-sectional view of one schematic structure of a portion 1800 of a semiconductor device 100 in accordance with an embodiment of the present disclosure. The polymer portions 1704a and 1704b in FIGS. 7A and 7B having holes 1712a and 1712b may be used as a mask for etching. Etching may be performed through the cover layer 1518 and the dielectric film 1536a in the holes 1712a and 1712b, and holes 1802a and 1802b may be formed through the dielectric film 1536a. In some embodiments, etching may be performed until exposing the conductive wire 1532a on an end of the interconnect 1528 in the dielectric film 1536a. A top portion of the polymer portions 1704a and 1704b may be removed during the etching. In some embodiments, surface portions of the polymer portions 1704a and 1704b on the cover layer 1518 may be removed by etching as well. Thus bottom portions 1804 above edge surfaces of the thick portions of the dielectric film 1536a may remain on the cover layer 1518 together with the liners 1522a and 1522b covering edge surfaces of the dielectric layers 1514 and 1516 facing the groove 1506.

Figure 19:
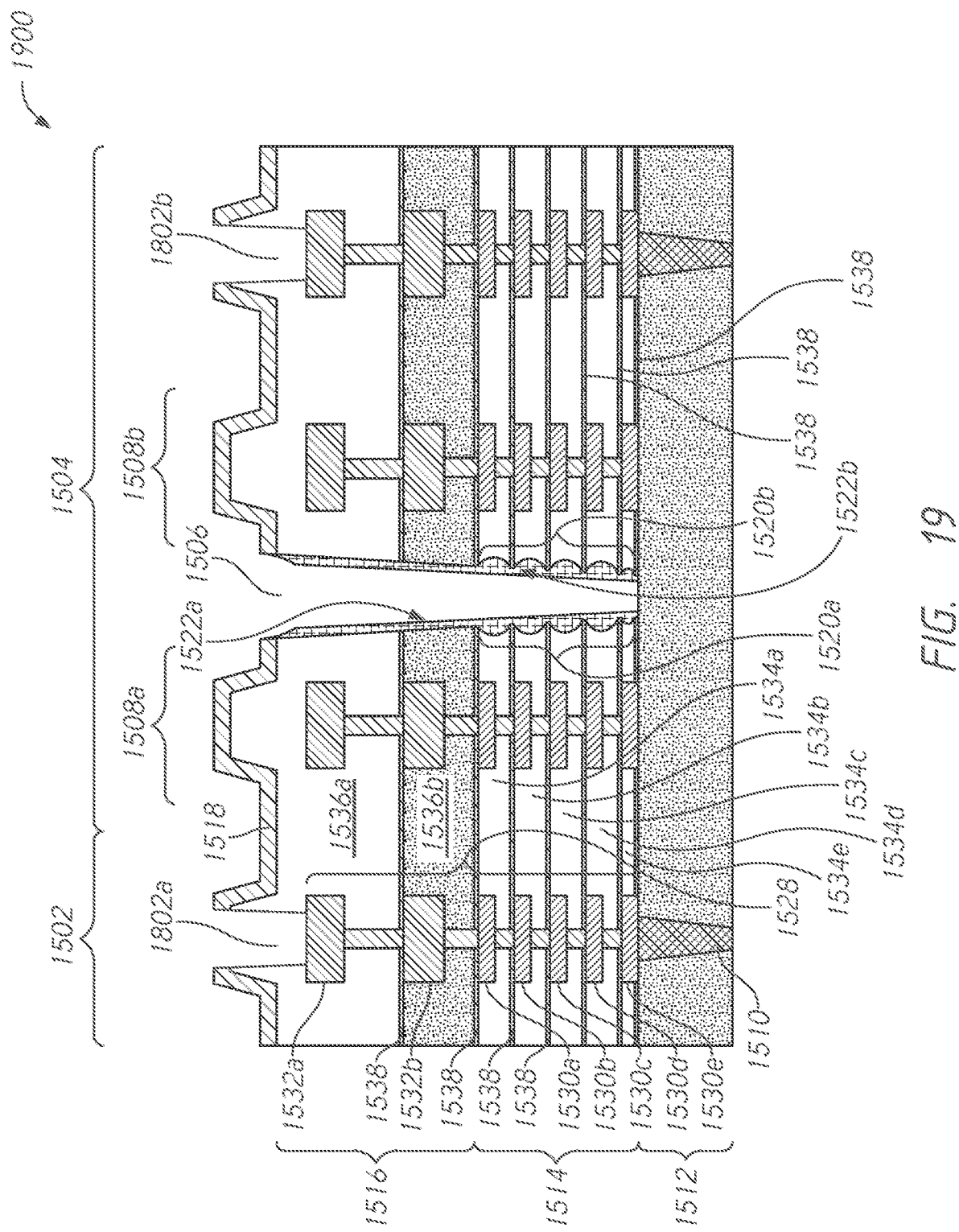
FIG. 19 is a diagram of vertical cross-sectional views of one schematic structure of a portion of a semiconductor device in accordance with an embodiment of the present disclosure.

As mentioned earlier, the degree of removal of the remaining bottom portions 1804 and a portion of the liners 1522a and 1522b may be controlled by conditions of oxygen plasma ashing. In some embodiments, a period of oxygen plasma ashing may be controlled. FIG. 19 is a diagram of a vertical cross-sectional view of one schematic structure of a portion 1900 of a semiconductor device 100 in accordance with an embodiment of the present disclosure. In some embodiments, the remaining portion 1804 on the cover layer 1518 above the edge surfaces of the thick portions of the dielectric film 1536a and inner portions of the liners 1522a and 1522b at a top opening of the groove 1506 may be removed during the ashing. Top portions of the remaining liners 1522a and 1522b facing the groove 1506 and connecting to the lines 1518 may become smoother after inner parts of the top portions of the remaining liners 1522a and 1522bc, being corners between the cover layer 1518 and edge surfaces of the dielectric layers 1516, may have been removed during the ashing. Thus, the liners 1522a and 1522b providing surfaces on the edge surfaces of the dielectric layers 1514 and 1516 facing the groove 1506, smoother than the portions 1520a and 1520b may be formed.

Figure 20:
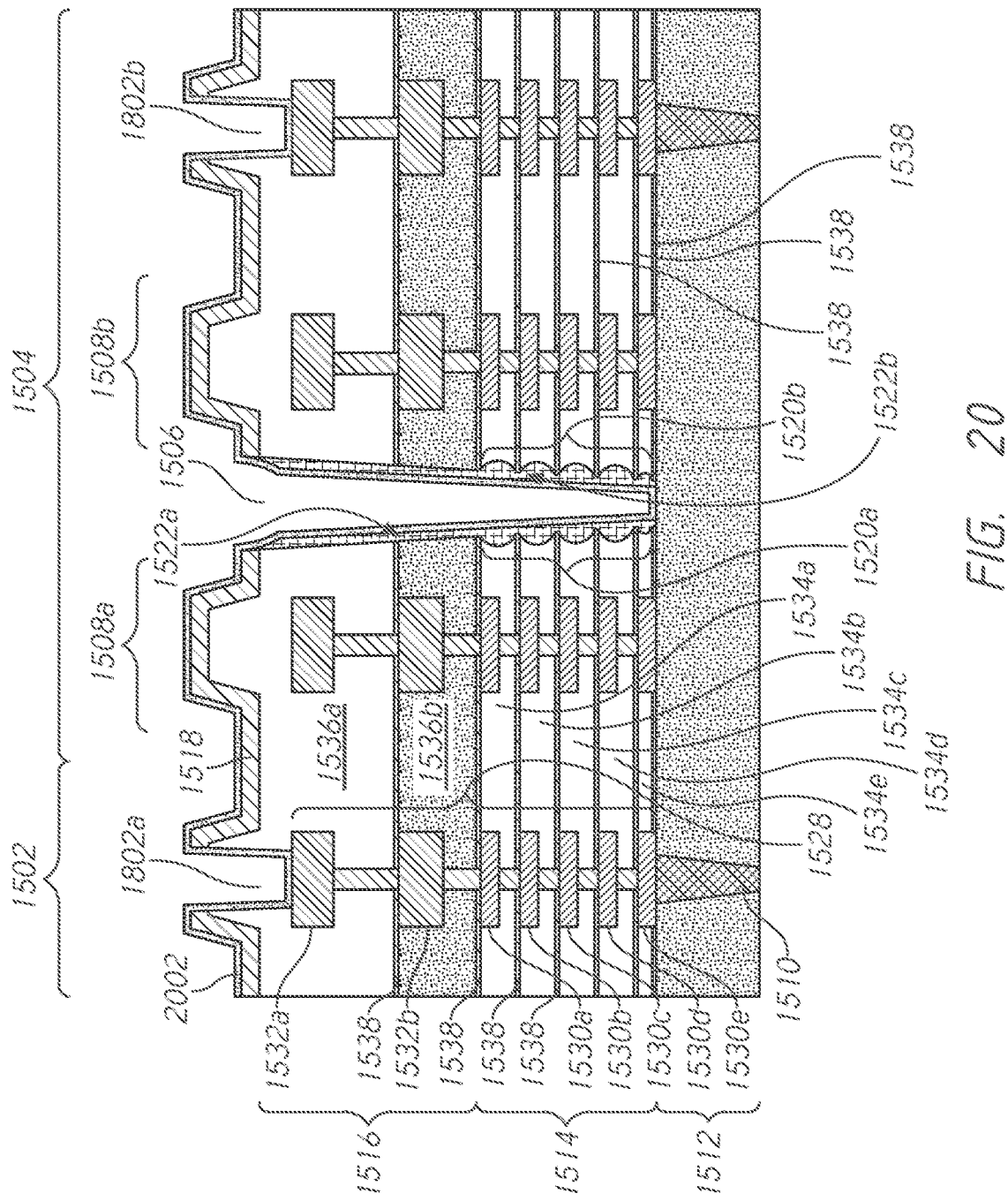
FIG. 20 is a diagram of vertical cross-sectional views of one schematic structure of a portion of a semiconductor device in accordance with an embodiment of the present disclosure.

FIG. 20 is a diagram of a vertical cross-sectional view of one schematic structure of a portion 2000 of a semiconductor device 100 in accordance with an embodiment of the present disclosure. After the oxygen plasma ashing, barrier and conductive seed layer 2002 may be deposited on the cover layer 1518 to cover the cover layer 1518, the holes 1802a and 1802b, the liners 1522a and 1522b and the bottom of the groove 1506 exposing a top surface of the semiconductor substrate 1512. Deposition methods and materials of the barrier and conductive seed layer 2002 may be similar to the deposition methods and the materials of the barrier and conductive seed layers 702, 802, 902 and 1402 thus the description of the deposition methods and the materials of the barrier and conductive seed layer 2002 is omitted for brevity. The barrier and conductive seed layer 2002 may cover the holes 1802a and 1802b, including edge surfaces and bottoms of the holes 1802a and 1802b. The barrier and conductive seed layer 2002 may include the conductive seed layer 1526 on the exposed conductive wire 1532a at the bottom of the hole 1802a. As illustrated in FIG. 20, portions of edge surfaces of the dielectric layers 1514 and 1516 in the groove 1506, including portions 1520a and 1520b may be covered by the liners 1522a and 1522b. Because the liners 1522a and 1522b provide smooth inner surfaces by covering the portions 1520a and 1520b, the barrier and conductive seed layer 2002 may be deposited on a top surface of the portion 2000 in a continuous and seamless manner. Thus, the conductive pillar 1524 in FIG. 15 may be successfully formed by electroplating on the conductive seed layer 1526. Because the liners 1522a and 1522b are divided by the groove 1506 and the top surface of the semiconductor substrate 1512 is exposed as shown in FIG. 15, dicing process of the structure of the portion 1500 may in the groove 1506 may be relatively easier compared to the structures of the portions 300 and 1000 having the cover layers above the top surfaces of the semiconductor substrates.

Liners including polymer on edge surfaces of dielectric layers (e.g., low-k films) having concave portions may provide smoother surfaces than edge surfaces. Because of the smoother surfaces of the liners, a barrier and conductive seed layer may be deposited on a top surface of a semiconductor device in a continuous and seamless manner. Thus, conductive pillars may be successfully formed by electroplating through the barrier and conductive seed layer.

Although various embodiments have been disclosed in the present disclosure, it will be understood by those skilled in the art that the scope of the disclosure extends beyond the specifically disclosed embodiments to other alternative embodiments and/or uses and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying embodiments. Thus, it is intended that the scope of at least some of the present disclosure should not be limited by the particular disclosed embodiments described above.

What is claimed is:

1. A semiconductor chip, comprising:
a substrate;
a plurality of first dielectric layers above the substrate, the plurality of first dielectric layers include an edge surface having roughness;
at least one second dielectric layer above the first dielectric layers;
a cover layer on the at least one second dielectric layer;
at least one liner including polymer covering the edge surface of the plurality of first dielectric layers to provide a surface smoother than the edge surface; and
a film on the cover layer and the at least one liner.

2. The semiconductor chip of claim 1, wherein the first dielectric layers include a first material that has a dielectric constant lower than a dielectric constant of a second material included in the at least one second dielectric layer.

3. The semiconductor chip of claim 2, wherein the at least one liner comprises a surface continuous with an edge surface of the second dielectric layer that is continuous with the cover layer.

4. The semiconductor chip of claim 2, wherein the at least one liner comprises a surface continuous with the cover layer.

5. The semiconductor chip of claim 4, wherein the film comprises polymer.

6. The semiconductor chip of claim 2, further comprising:
a wire in the second dielectric layer in the circuit region;
a conductive seed layer on the wire; and
a conductive pillar in a hole in the second dielectric layer, the conductive pillar disposed on the conductive seed layer.

7. The semiconductor chip of claim 6, wherein the conductive pillar comprises at least one of copper or nickel.

8. An apparatus, comprising:
a multilayer structure including:
a first circuit region, a second circuit region and a scribe region between the first circuit region and the second circuit region;
a substrate across the first circuit region and the second circuit region; and
at least one dielectric layer above the substrate and across the first circuit region and the second circuit region;
a groove in the at least one dielectric layer and in the scribe region; and
at least one liner comprising polymer, the at least one liner covering a surface of the groove, and the at least one liner comprising a surface smoother than an edge surface of the at least one dielectric layer.

9. The apparatus of claim 8, wherein the liner comprises a negative-tone photoresist.

10. The apparatus of claim 8, wherein the liner comprises a positive-tone photoresist.

11. The apparatus of claim 8, wherein the polymer comprises polyimide or phenolic resin.

12. The apparatus of claim 8, wherein the groove is filled by the polymer to a top opening of the groove.

13. The apparatus of claim 8, wherein the multilayer structure further comprises at least one another dielectric layer above the at least one dielectric layer, wherein the polymer is configured to cover the edge surfaces of the other dielectric layer without filling to a top opening of the groove.

14. The apparatus of claim 8, further comprising a dicing line in the groove.

15. The apparatus of claim 8, wherein the groove is a first groove, the apparatus further comprising:
- a second groove between the first groove and the second circuit region; and
- a dicing line between the first groove and the second groove.

\* \* \* \* \*